(12) United States Patent
Twitto et al.

(10) Patent No.: US 9,384,087 B2
(45) Date of Patent: Jul. 5, 2016

(54) METHOD AND APPARATUS FOR ENCODING AND DECODING DATA IN MEMORY SYSTEM

(71) Applicant: Samsung Electronics Co., Ltd., Suwon-Si, Gyeonggi-Do (KR)

(72) Inventors: Moshe Twitto, Ramat Gan (IL); Avner Dor, Ramat Gan (IL); Jun Jin Kong, Yongin-si (KR); Jung Soo Chung, Seongnam-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 51 days.

(21) Appl. No.: 14/542,828

(22) Filed: Nov. 17, 2014

(65) Prior Publication Data

US 2015/0149859 A1    May 28, 2015

(30) Foreign Application Priority Data

Nov. 25, 2013    (KR) ........................ 10-2013-0143913

(51) Int. Cl.
*H03M 13/03* (2006.01)
*G06F 11/10* (2006.01)
*H03M 13/11* (2006.01)
*H03M 13/37* (2006.01)
*H03M 13/00* (2006.01)

(52) U.S. Cl.
CPC ......... *G06F 11/1012* (2013.01); *H03M 13/036* (2013.01); *H03M 13/118* (2013.01); *H03M 13/1157* (2013.01); *H03M 13/373* (2013.01); *H03M 13/3746* (2013.01); *H03M 13/611* (2013.01); *G06F 11/108* (2013.01); *G06F 2211/109* (2013.01)

(58) Field of Classification Search
CPC ............ G06F 11/1008; G06F 11/1012; G06F 12/0207; G06F 12/0813; H03M 13/611; H03M 13/373; H03M 13/118
See application file for complete search history.

(56) References Cited

U.S. PATENT DOCUMENTS

| | | | |
|---|---|---|---|
| 6,473,877 B1 * | 10/2002 | Sharma | G11B 20/1816 714/712 |
| 6,895,421 B1 | 5/2005 | Dor et al. | |
| 8,972,649 B2 * | 3/2015 | Davis | G06F 12/0207 711/102 |
| 2004/0210799 A1 | 10/2004 | Cargnoni et al. | |
| 2004/0210814 A1 | 10/2004 | Cargnoni et al. | |

(Continued)

FOREIGN PATENT DOCUMENTS

| | | |
|---|---|---|
| JP | 2008-047283 A | 2/2008 |
| JP | 2009-217922 A | 9/2009 |
| JP | 2010-191984 A | 9/2010 |

*Primary Examiner* — Shelly A Chase
(74) *Attorney, Agent, or Firm* — Harness, Dickey & Pierce, P.L.C.

(57) ABSTRACT

Example embodiments disclose methods and apparatuses for encoding and decoding data in a memory system. In an encoding method according to an example embodiment of inventive concepts, a codeword is generated based on a combination of data to be stored and auxiliary data according to stuck cells and an encoding matrix based on information regarding coordinates of the stuck cells and values of the stuck cells. The generated codeword includes data corresponding to the values of the stuck cells at addresses corresponding to the coordinates of the stuck cells. In a decoding method according to an example embodiment of inventive concepts, data may be generated by multiplying an inverse matrix of the encoding matrix used for encoding by the codeword.

20 Claims, 15 Drawing Sheets

(56) References Cited

U.S. PATENT DOCUMENTS

| | | |
|---|---|---|
| 2010/0020620 A1 | 1/2010 | Kim et al. |
| 2011/0041016 A1 | 2/2011 | O'Connell |
| 2013/0301353 A1 | 11/2013 | Twitto et al. |
| 2014/0101516 A1* | 4/2014 | Mateescu ............ G06F 11/1012 714/766 |

* cited by examiner

FIG. 5

$\alpha = \{2, 5\}, \mu = \{0, 1\}$ $$\nu = G \cdot x = \begin{bmatrix} \nu_1 \\ 0 \\ \nu_3 \\ \nu_4 \\ 1 \\ \nu_6 \\ \nu_7 \\ \nu_8 \end{bmatrix} = \begin{bmatrix} 1 & 0 & 0 & 0 & 0 & 0 & 0 & 0 \\ 0 & 0 & 1 & 0 & 0 & 0 & 0 & 0 \\ 1 & 1 & 0 & 0 & 0 & 0 & 0 & 0 \\ 1 & 0 & 0 & 1 & 0 & 0 & 0 & 0 \\ 0 & 1 & 0 & 0 & 1 & 0 & 0 & 0 \\ 0 & 1 & 1 & 0 & 0 & 1 & 0 & 0 \\ 0 & 1 & 0 & 0 & 0 & 0 & 1 & 0 \\ 0 & 0 & 1 & 0 & 0 & 0 & 0 & 1 \end{bmatrix} \begin{bmatrix} w_1 \\ w_2 \\ w_3 \\ 1 \\ 1 \\ 1 \\ 0 \\ 1 \end{bmatrix}$$

$w_3 = 0$
$w_2 = 0$ $\Rightarrow$ $w = \begin{bmatrix} 0 \\ 0 \\ 0 \end{bmatrix}$ or $\begin{bmatrix} 1 \\ 0 \\ 0 \end{bmatrix}$

FIG. 6

$$x' = G^{-1} \cdot v' = \begin{bmatrix} 1 & 0 & 0 & 0 & 0 & 0 & 0 & 0 \\ 1 & 0 & 1 & 0 & 0 & 0 & 0 & 0 \\ 0 & 1 & 0 & 0 & 0 & 0 & 0 & 0 \\ 1 & 0 & 0 & 1 & 0 & 0 & 0 & 0 \\ 1 & 0 & 1 & 0 & 1 & 0 & 0 & 0 \\ 1 & 1 & 1 & 0 & 0 & 1 & 0 & 0 \\ 1 & 0 & 1 & 0 & 0 & 0 & 1 & 0 \\ 0 & 1 & 0 & 0 & 0 & 0 & 0 & 1 \end{bmatrix} \begin{bmatrix} 1 \\ 0 \\ 1 \\ 0 \\ 1 \\ 1 \\ 0 \\ 1 \end{bmatrix} = \begin{bmatrix} 1 \\ 0 \\ 0 \\ 1 \\ 1 \\ 1 \\ 0 \\ 1 \end{bmatrix} \begin{matrix} w' \\ \\ \\ u' \end{matrix}$$

FIG. 7

$$G = \begin{bmatrix} G_1 \\ (n \times s) \end{bmatrix} \begin{bmatrix} G_2 \\ (n \times (n-s)) \end{bmatrix} = \begin{bmatrix} G_{11} & 0_{s \times (n-s)} \\ G_{21} & I_{(n-s) \times (n-s)} \end{bmatrix}$$

$$\Rightarrow G^{-1} = \begin{bmatrix} G_{11}^{-1} & 0_{s \times (n-s)} \\ -G_{21} G_{11}^{-1} & I_{(r-s) \times (n-s)} \end{bmatrix}$$

FIG. 8A $$G = \begin{bmatrix} I_{s \times s} & 0_{s \times (n-s)} \\ G_{21} & I_{(n-s) \times (n-s)} \end{bmatrix} \Rightarrow G^{-1} = \begin{bmatrix} I_{s \times s} & 0_{s \times (n-s)} \\ G_{21} & I_{(n-s) \times (n-s)} \end{bmatrix}$$

FIG. 8B $$s=14, s'=10 \Rightarrow \begin{cases} e_i = [\,0,\,0,\,1,\,0,\,0,\,0,\,0,\,0,\,0,\,0,\,0,\,0,\,0,\,0\,] \quad (i=3) \\ e_j = [\,0,\,0,\,0,\,0,\,0,\,0,\,0,\,1,\,0,\,0,\,0,\,0,\,0,\,0\,] \quad (j=8) \\ q = [\,0,\,0,\,0,\,0,\,0,\,0,\,0,\,0,\,0,\,0,\,1,\,0,\,0,\,1\,] \end{cases}$$

$r = e_i + e_j + q$ $$G_1 = \begin{bmatrix} 0 & 0 & 1 & 0 & 0 & 0 & 1 & 0 & 0 & 0 & 1 & 1 & 0 & 0 \\ 0 & 0 & 1 & 0 & 0 & 0 & 0 & 1 & 0 & 0 & 1 & 0 & 0 & 1 \\ 0 & 1 & 0 & 0 & 0 & 0 & 0 & 0 & 0 & 1 & 0 & 1 & 1 & 0 \\ 0 & 0 & 0 & 0 & 1 & 0 & 0 & 1 & 0 & 0 & 1 & 0 & 0 & 1 \\ & & & & & & \vdots & & & & \vdots & & & \end{bmatrix}$$

FIG. 8C $$G_1 = H^T = \begin{bmatrix} G_1 \\ (n \times s) \end{bmatrix} = \begin{bmatrix} H \\ (s \times n) \end{bmatrix}^T$$

METHOD AND APPARATUS FOR ENCODING AND DECODING DATA IN MEMORY SYSTEM

CROSS-REFERENCE TO RELATED APPLICATIONS

This application claims the benefit of Korean Patent Application No. 10-2013-0143913, filed on Nov. 25, 2013, in the Korean Intellectual Property Office, the disclosure of which is incorporated herein in its entirety by reference.

BACKGROUND

Inventive concepts relate to methods and apparatuses for encoding and decoding data in a memory system.

An error-correcting code (ECC) used in a memory system may be used for detecting errors, correcting the errors, and restoring data. The errors may include random errors that may not be predicted in advance and errors that may be predicted in advance. For example, if a portion of a memory is no longer functional due to a structural defect of the memory, errors may always occur in data stored in the corresponding portion of the memory. A location of the portion of the memory may be determined through a test.

If large resources of a memory system are dedicated to performing a particular ECC, the ECC may deteriorate the performance of the memory system.

SUMMARY

Provided are methods and apparatuses for encoding and decoding data in a memory system based on information regarding coordinates and values of stuck cells.

Additional aspects will be set forth in part in the description which follows and, in part, will be apparent from the description, or may be learned by practice of the presented embodiments.

According to an aspect of the inventive concept, an encoder includes a first vector generating unit configured to generate a vector u corresponding to data to be stored in a plurality of memory cells including t stuck cells, the vector a having n−s entries n, s, and t are integers, n is greater than or equal to s, s is greater than or equal, to t and t is greater than or equal to zero, a matrix generating unit, configured to generate an encoding matrix G, a second vector generating unit configured to receive information α and information μ and generate a vector w having s entries based on the information α, the information μ, and the encoding matrix G, the information α including coordinated of the stuck cells, and the information μ including values of the stuck cells, and a third vector generating unit configured to generate a vector v having n entries based on the encoding matrix G and a vector x, the vector x being a concatenation of the vector w and the vector u, and entries of the vector v correspond to the information α and include the values of the stuck cells according to the information μ.

In an example embodiment, $\alpha=\{\alpha(1), \ldots, \alpha(t)\}$, $1 \leq \alpha(1) < \ldots < \alpha(t) \leq n$, $\mu=\{\mu(1), \ldots, \mu(t)\}$, $u=[u_1 \ldots u_{n-s}]^T$, $w=[w_1 \ldots w_s]^T$, $x=[w_1 \ldots w_s u_1 \ldots u_{n-s}]^T$, an $v=[v_1 \ldots v_n]^T$, $v_{\alpha(j)}=\mu(j)$, $1 \leq j \leq t$ where j is an integer, the matrix generating unit configured to generate the encoding matrix G such that $G=[G_1, G_2]=G_{11}, 0_{s \times (n-s)}; G_{21}, I_{(n-s) \times (n-s)}]$, $G_1$ is a n×s first encoding matrix, $G_2$ is a n×(n−s) a second encoding matrix, $G_{11}$ is a s×s invertible matrix, $G_{21}$ is a (n−s)×s matrix, $0_{s \times (n-s)}$ is a zero matrix, and $I_{(n-s) \times (n-s)}$ is a unit matrix, the second vector generating unit is configured to generate the vector w such that $[G_1 \cdot w]_{\alpha(j)} = \mu(j) - [G_2 \cdot u]_{\alpha(j)}$ ($1 \leq j \leq t$), which are t linear equations, and the third vector generating unit is configured to determine a vector y such that $y=[y_1 \ldots y_n]^T = G_1 \cdot w$ and $v=[v_1 \ldots v_n]^T = y + [0 \ldots 0 \; u_1 \ldots u_{n-s}]^T$.

The encoder further includes a header generating unit configured to generate a header including a label of the encoding matrix G and s.

The s×s invertible matrix $G_{11}$ is a unit matrix and the (n−s)×s matrix $G_{21}$ includes independently and identically distributed (i.i.d.) entries having values 0 or 1, each of the i.i.d. values having a ½ probability of being 1.

The matrix generating unit is configured to generate rows of the first encoding matrix $G_1$ based on sample row vectors that are independently and identically distribution.

The matrix generating unit is configured to generate the first encoding matrix $G_1$ as a transposed matrix $H^T$ of a check matrix H for binary erasure channel (BEC) codes.

According to another aspect of the inventive concept, a method for encoding data, the method includes generating a vector u corresponding to data to be stored in n memory cells including t stuck cells the vector u having n−s entries, where n, s, and t are integers, n is greater than or equal to s, s is greater than or equal to t and t is greater than or equal to zero, generating a vector w having s entries based on information α and information μ, the information α including coordinates of the stuck cells and the information μ including values of the stuck cells, generating an n×n encoding matrix G, and generating a vector v having n entries based on the encoding matrix G and a vector x, the vector x being a concatenation of the vector w and the vector u, and entries of the vector v correspond to the information α and include the values of the stuck cells according to the information μ.

The encoding matrix G includes a n×s first encoding matrix $G_1$ and a n×(n−s) second encoding matrix $G_2$, the generating of the vector w includes determining t linear equations and employing s roots as entries of the vector w, coefficients of the t linear equations are entries included in rows of the first encoding matrix $G_1$ corresponding to the information α, and determining constant terms of the t linear equations based on calculations of entries in rows of the second encoding matrix $G_2$.

The generating the vector v adds a product of the first encoding matrix $G_1$ and the vector w to a product of the second encoding matrix $G_2$ and the vector u.

The generating the vector w further includes, replacing the encoding matrix G with another encoding matrix G, if s roots do not exist. The method includes generating a header including a label of the encoding matrix G.

The method further includes generating the encoding matrix G by using at least one matrix that is randomly or pseudo-randomly sampled.

The generating of the encoding matrix G includes generating a first encoding matrix $G_1$, the first encoding matrix $G_1$ including a s×s invertible matrix $G_{11}$ and a (n−s)×s matrix $G_{21}$; and generating a second encoding matrix $G_2$ by combining a zero matrix $0_{s \times (n-s)}$ and a unit matrix $I_{(n-s) \times (n-s)}$.

The generating of the first encoding matrix $G_1$ includes configuring the s×s invertible matrix $G_{11}$ as a s×s unit matrix $I_{s \times s}$; and configuring the (n−s)×s matrix $G_{21}$ such that the (n−s)×s matrix $G_{21}$ includes independently and identically distributed (i.i.d.) entries having values 0 or 1, each of the i.i.d. entries having a ½ probability of being 1.

The generating of the first encoding matrix $G_1$ includes generating a row vector including s entries having values of 0 or 1, each of the s entries having a corresponding index, only one of the s entries having a corresponding index between 1 and $s'/2$ is 1, only one of the s entries having a corresponding index between from (s'/2)+1 through s' is 1, and the probability that a value of each of entries of the row vector of which indexes are from s'+1 through s becomes 1 is ½, and generating the first encoding matrix $G_1$ based on the generated row vector, s' is an even number and s'≤s≤t.

The generating of the first encoding matrix $G_1$ is a transposed matrix $H^T$ of a check matrix H for binary erasure channel (BEC) codes.

At least one example embodiment discloses a method of processing data to be stored in a plurality of memory cells including a plurality of stuck cells, each of the stuck cells storing a value. The method includes obtaining input data and stock cell information, the stuck cell information indicating locations of the plurality of stuck cells in the plurality of memory cells and the values of the plurality of stuck cells, generating a first vector based on the input data, generating an encoding matrix, generating a second vector based on the stuck cell information and the encoding matrix, a number of entries of the second vector being greater than or equal to a number of the plurality of stuck cells and generating encoded data based on the first vector, the encoding matrix and the second vector, the encoded data including values corresponding to the locations of the plurality of stuck cells in the plurality of memory cells and the values of the plurality of stuck cells.

In an example embodiment, the method includes generating label information, the label information identifying the encoding matrix and the number of entries of the second vector.

In an example embodiment, the method includes decoding the encoded data using the label information.

In an example embodiment, the encoding matrix includes a first encoding matrix part and a second encoding matrix part, the second encoding matrix part including a zero matrix and a unit matrix.

In an example embodiment, the method includes storing the first encoding matrix part and an inverse of a portion of the first encoding matrix part.

BRIEF DESCRIPTION OF TEE DRAWINGS

Example embodiments of inventive concepts will be more clearly understood from the following detailed description taken in conjunction with the accompanying drawings in which:

FIG. 5 is a diagram for describing operation of a generating unit according to an example embodiment of inventive concepts.

FIG. 6 is a diagram for describing operations of the v generating unit and the decoder according to an example embodiment of Inventive concepts.

FIG. 7 is a diagram showing an encoding matrix according to an example embodiment of inventive concepts.

FIGS. 8A through 8C are diagrams showing encoding matrixes according to example embodiments of inventive concepts.

DETAILED DESCRIPTION OF EXAMPLE EMBODIMENTS

Figure 1:
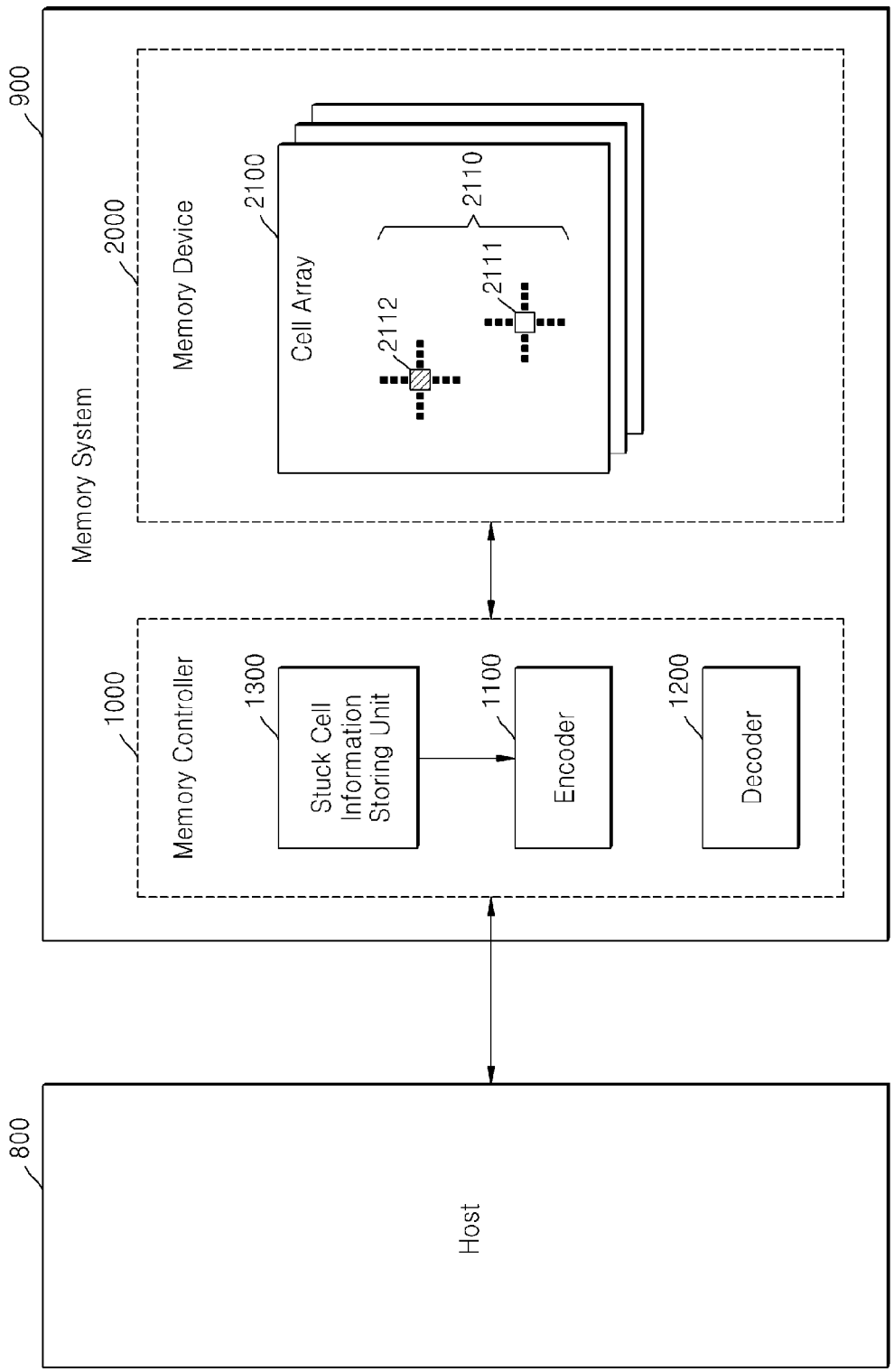
FIG. 1 is a diagram showing a memory system according to an example embodiment of inventive concepts.

Example embodiments will now be described more fully with reference to the accompanying drawings. Many alternate forms may be embodied and example embodiments should not be construed as limited to example embodiments set forth herein. In the drawings, like reference numerals refer to like elements.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood, that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Specific details are provided in the following description to provide a thorough understanding of example embodiments. However, it will be understood by one of ordinary skill in the art that example embodiments may be practiced without these specific details. For example, systems may be shown in block diagrams so as not to obscure the example embodiments in unnecessary detail. In other instances, well-known processes, structures and techniques may be shown without unnecessary detail in order to avoid obscuring example embodiments.

In the following description, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware in existing electronic systems (e.g., nonvolatile memories universal flash memories, universal flash memory controllers, nonvolatile memories and memory controllers, digital point-and-shoot cameras, personal digital assistants (PDAs), smartphones, tablet personal computers (PCs), laptop computers, etc.). Such existing hardware may include one or more Central Processing Units (CPUs), digital signal processors (DSPs), application-specific-integrated-circuits (ASICs), field programmable gate arrays (FPGAs) computers or the like.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium", "computer readable storage medium" or "non-transitory computer readable storage medium" may represent one or more devices for storing data, including read only memory (ROM), random access memory (RAM), magnetic RAM, core memory, magnetic disk storage mediums, optical storage mediums, flash memory devices and/or other tangible machine readable mediums for storing information. The term "computer-readable medium" may include, but is not limited to, portable or fixed storage devices, optical storage devices, and various other mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors may be programmed to perform the necessary tasks, thereby being transformed into special purpose processor(s) or computer(s).

A code segment may represent a procedure, function, subprogram, program, routine, subroutine, module, software package, class, or any combination of instructions, data structures or program statements. A code segment may be coupled to another code segment or a hardware circuit by passing and/or receiving information, data, arguments, parameters or memory contents. Information, arguments, parameters, data, etc. may be passed, forwarded, or transmitted via any suitable means including memory sharing, message passing, token passing, network transmission, etc.

Hereinafter, the term entry refers to an element of a matrix or a vector, where an element and an entry of a matrix or a vector have the identical meaning. Furthermore, when $A \in F^{N \times N}$, $B \in F^{N \times M}$, $C \in F^{M \times N}$, and $D \in F^{M \times M}$, the following equation may be established:

$$U = \begin{bmatrix} A & B \\ C & D \end{bmatrix} = [A, B; C, D].$$

FIG. 1 is a diagram showing a memory system 900 according to an example embodiment of inventive concepts. As shown in FIG. 1, the memory system 900 may communicate with a host 800 in compliance with a protocol. For example, the memory system 900 may support protocols including advanced technology attachment (ATA) interface, serial advanced technology attachment (SATA) interface, parallel advanced technology attachment (PATA) interface, universal serial bus (USB) or serial attached small computer system (SAS) interface, small computer system interface (SCSI) interface, embedded multimedia card (EMMC) interface, and unix file system (UFS) interfaced. However, the above-stated interfaces are merely examples, and example embodiments of inventive concepts are not limited thereto.

As shown in FIG. 1, the memory system 900 may include a memory controller 1000 and a memory device 2000. The memory controller 1000 may control the memory device 2000, may receive a request from the host 800 outside the memory system 900, and may transmit a response to the request to the host 800. The memory device 2000 may include a non-volatile memory device, e.g., a flash memory, a phase change RAM (PRAM), a ferroelectric RAM (FRAM), a magnetic RAM (MRAM), etc.

As shown in FIG. 1, the memory device 2000 may include a cell array 2100, and the cell array 2100 may include a plurality of memory cells 2110 arranged in an array shape. For example, a flash memory may include a plurality of blocks, each of the blocks may include a plurality of pages, and the cell array 2100 may correspond to a page or a block of the flash memory.

The memory cell 2110 is capable of storing the smallest unit of data stored in the memory device 2000 and may have different states according to data stored therein. The memory device 2000 may write data by changing a state of the memory cell 2110 and may output data according to the state of the memory cell 2110. Data corresponding to the state of the memory cell 2110 is referred to as a value of the memory cell 2110. Although not shown in FIG. 1, the memory device 2000 may include peripheral circuits for controlling the cell array 2100, and the memory controller 1000 may write data to the cell array 2100 or read data from the cell array 2100 by using the peripheral circuits.

Each of the memory cells 2110 may have two or more different states, and the number of bits of data that may be stored in each of the memory cells 2110 may be determined based on the number of states each of the memory cells 2110 may have. For example, in case of a flash memory, the memory cell 2110 may include a single level cell (SLC)

capable of storing 1-bit data or a multi level cell (MLC) capable of storing 2-bit data or more data, according to a distribution of threshold voltages of a transistor included in the memory cell 2110. Hereinafter, it is assumed that the memory cell 2110 may have a value of 0 or 1 and is capable of storing 1-bit data. However, example embodiments of inventive concepts are not limited thereto.

Meanwhile, as shown in FIG. 1, the cell array 2100 may include not only normal cells 2111, whose states may be changed according to data stored therein, but also stuck cells 2112, whose states may not be changed according to data stored therein. Therefore, the stuck cell 2112 may cause errors in data. The stuck cell 2112 may be formed due to manufacturing process of the memory device 2000, abnormal electric signals applied from outside, or an end-of-life of the memory cell 2110.

As shown in FIG. 1, the memory controller 1000 may include an encoder 1100, a decoder 1200, and a stuck cell information storing unit 1300. The encoder 1100 may encode data for performing an error correction code (ECC), whereas the decoder 1200 may receive encoded data, that is, a codeword and decode the codeword. According to an example embodiment of inventive concepts, the stuck cell information storing unit 1300 may store information regarding the stuck cell 2112 included in the cell array 2100 of the memory device 2000. For example, the stuck cell information storing unit 1300 may store the coordinate and the value of the stuck cell 2112 included in the cell array 2100. Detailed descriptions thereof will be given below.

The encoder 1100 may receive stuck cell information from the stuck cell information storing unit 1300 and may generate a codeword by encoding data based on the received stuck cell information. The encoder 1100 and the decoder 1200 may share encoding information (e.g., encoding matrix G) used for encoding data. In other words, the encoder 1100 may add encoding information to the header of a codeword, and the decoder 1200 may decode the codeword by using the encoding information added to the header.

The encoder 1100 and the decoder 1200 may be embodied hardware, firmware, hardware executing software or any combination thereof included in the memory controller 1000.

When the encoder 1100 and the decoder 1200 are hardware, such hardware may include one or more Central Processing Units (CPUs), digital signal processors (DSPs), application-specific-integrated-circuits (ASICs), field programmable gate arrays (FPGAs) computers or the like configured as special purpose machines to perform the functions of the encoder 1100 and the decoder 1200. CPUs, DSPs, ASICs and FPGAs may generally be referred to as processors and/or microprocessors.

In the event that the encoder 1100 and the decoder 1200 are processors executing software, the processors are configured as special purpose machine to execute the software to perform the functions of the encoder 1100 and the decoder 1200. In such an embodiment, the controller 1000 may include one or more Central Processing Units (CPUs), digital signal processors (DSPs), application-specified-integrated-circuits (ASICs), field programmable gate arrays (FPGAs) computers.

Furthermore, although FIG. 1 shows that the memory controller 1000 includes the independent encoder 1100 and the independent decoder 1200, the encoder 1100 and the decoder 1200 may be embodied as a single element.

Figure 2:
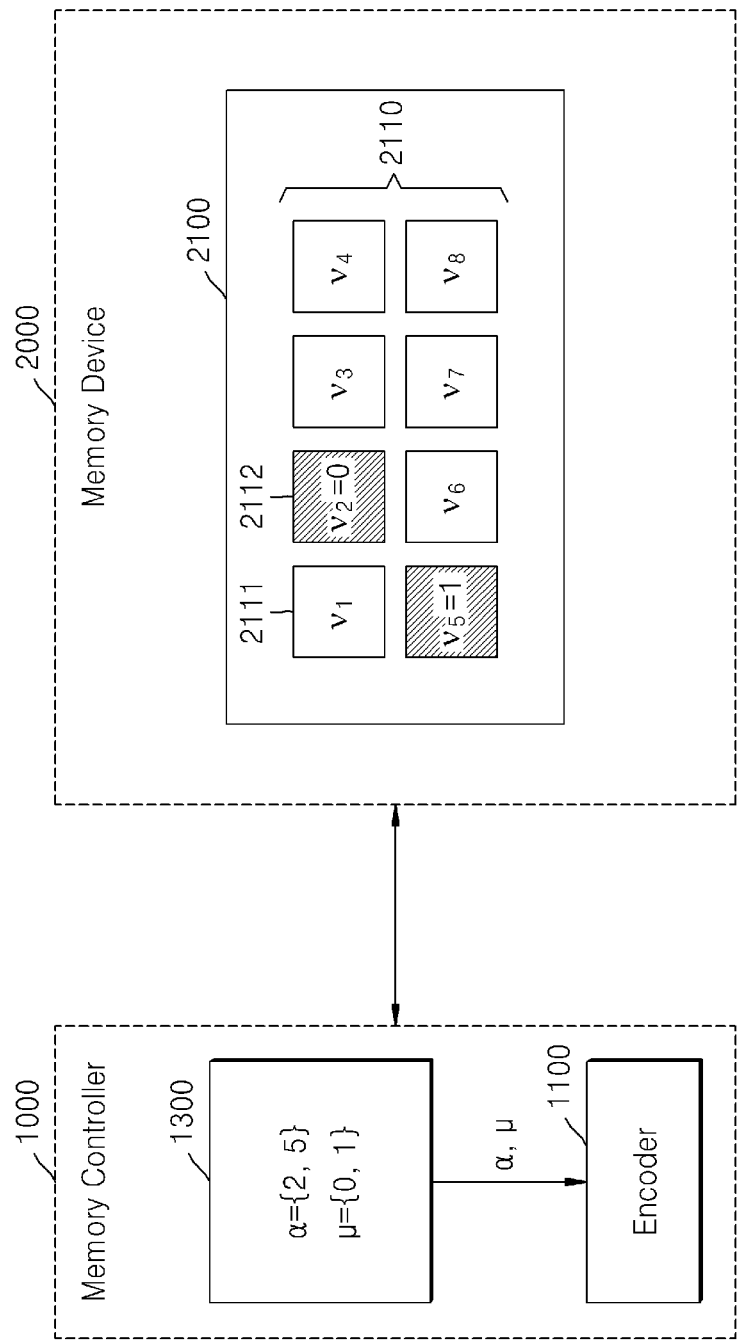
FIG. 2 is a diagram showing an example of stuck cell information storing units according to an example embodiment of inventive concepts.

FIG. 2 is a diagram showing an example of the stuck cell information storing unit 1300 according to an example embodiment of inventive concepts. The cell array 2100 may include the plurality of memory cells 2110 arranged in an array shape, and the stuck cell information storing unit 1300 may store information regarding stuck cells included in the cell array 2100. For example, as shown in FIG. 2, the cell array 2100 may include the eight memory cells 2110, and two from among the eight memory cells 2110 may be stuck cells. The eight memory cells 2110 may have coordinates 1 through 8, respectively, and the coordinates of the memory cells 2110 may be addresses of the memory cells 2110.

As shown in FIG. 2, when the eight memory cells 2110 have values $v_1$ through $v_8$, respectively, data stored in the cell array 2100 may be expressed as a column vector $v=[v_1 \ldots v_8]^T$. However, as shown in FIG. 2, when the memory cells respectively corresponding to the coordinates 2 and 5 are stuck cells and respectively have fixed values of 0 and 1, values $v_2$ and $v_5$ of the column vector v stored in the cell array 2100 may be expressed as a column vector $v=[v_1\ 0\ v_3\ v_4\ 1\ v_6\ v_7\ v_8]^T$.

According to an example embodiment of inventive concepts, the stuck cell information storing unit 1300 may store information α regarding coordinates of stuck cells included in the cell array 2100 and information μ regarding values of the stuck cells. For example, in case of the cell array 2100 shown to FIG. 2, the stuck cell information storing unit 1300 may store information α={2, 5} as coordinates of stuck cells and may store information μ={0, 1} as values of the stuck cells corresponding to the coordinates. The encoder 1100 of FIG. 1 may receive the information α and μ from the stuck cell information storing unit 1300, encode data based on the information α and μ, and generate a column vector v corresponding to data to be stored in the cell array 2100. The column vector v generated by the encoder 1100 may include $v_2=0$ and $v_5=1$.

Referring to FIGS. 1 and 2, when the cell array 2100 includes n memory cells 2110 and t memory cells 2110 from among the n memory cells 2110 are the stuck cell 2112 (n>t≥0), the information α regarding coordinates of the stuck cells 2112, the information μ regarding values of the stuck cells 2112, and a column vector v corresponding to data stored in the cell array 2100 may be expressed as shown below.

$$v=[v_1 \ldots v_n]^T \in \mathbf{1}\ F^n(F=GF(2))$$

$$\alpha=\{\alpha(1),\ldots,\alpha(t)\},\ \alpha(1)<\ldots<\alpha(t))$$

$$\mu=\{\mu(1),\ldots,\mu(t)\}$$

$$v_{\alpha(j)}=\mu(j)(1\leq j\leq t)$$

where G is an encoding matrix generated by the encoder 1100.

Figures 3, 4:
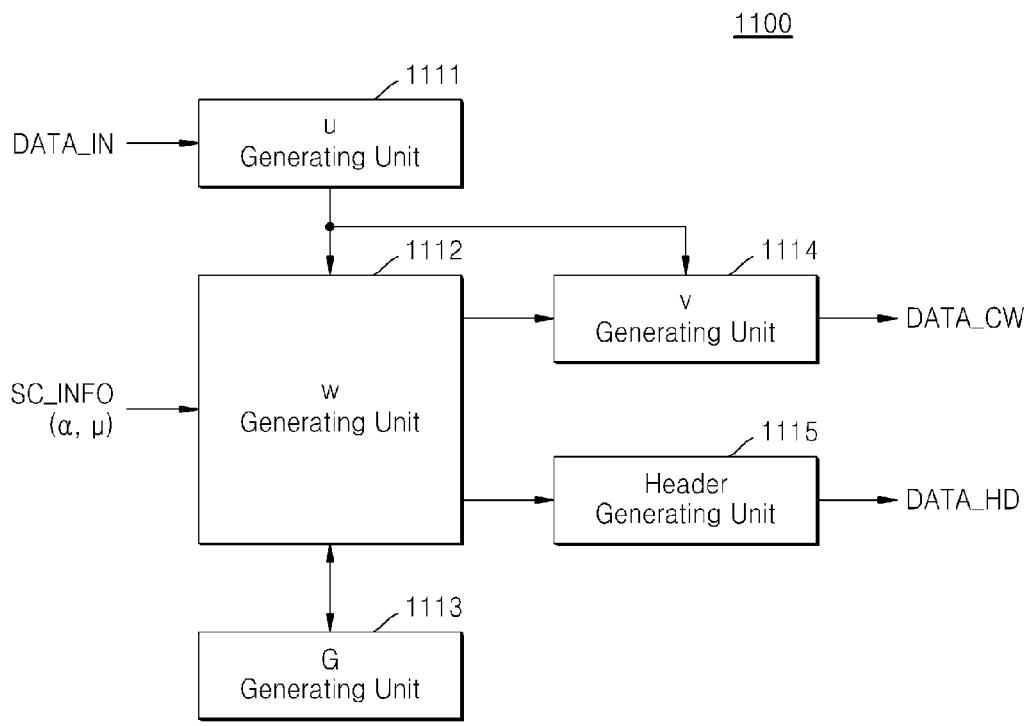
FIG. 3 is a schematic block diagram showing the structure of an encoder according to an example embodiment of inventive concepts.
FIG. 4 is a diagram showing operation of the encoder according to an example embodiment of inventive concepts as equations.

FIG. 3 is a schematic block diagram showing the structure of the encoder 1100 according to an example embodiment of inventive concepts. According to an example embodiment of inventive concepts, the encoder 1100 may include a first vector generating unit, a second vector generating unit, a third vector generating unit, a matrix generating unit, and a header generating unit. For example, FIG. 3 shows an embodiment in which the first vector generating unit is a u generating unit 1111, the second vector generating unit is a w generating unit 1112, the third vector generating unit is a v generating unit 1114, and the matrix generating unit is a G generating unit 1113.

The encoder 1100 may receive input data DATA_IN and stuck cell information SC_INFO and may generate and output codeword DATA_CW and header DATA_HD. The input data DATA_IN may include data the host 800 requested the memory system 900 to write, that is, user data and metadata generated by the memory controller 1000 to manage the memory device 2000. Furthermore, the stuck cell information SC_INFO received by the encoder 1100 from the stuck cell information storing unit 1300 may include the information α regarding coordinates of stuck cells and information μ regarding values of the stuck cells.

The encoder 1100 may generate the codeword DATA_CW, and the codeword DATA_CW may include values of stuck cells at addresses corresponding to coordinates of the stuck cells. Furthermore, the encoder 1100 may generate the header DATA_HD including encoding information regarding the codeword DATA_CW, and the header DATA_HD may be stored in the memory controller 1000 or the memory device 2000 separately from the codeword DATA_CW.

According to an example embodiment of inventive concepts as shown in FIG. 3, the encoder 1100 may include the u generating unit 1111, the w generating unit 1112, the G generating unit 1113, the v generating unit 1114, and a header generating unit 1115. The u generating unit 1111 may receive the input data DATA_IN and generate a column vector $u=[u_1 \ldots u_{n-s}]^T (0 \leq t \leq s < n)$. The u generating unit 1111 may select data to be stored in the cell array 2100 including the n memory cells 2110 from among the input data DATA_IN and generate the column vector u. Since the cell array 2100 includes t stuck cells, the u generating unit 1111 is unable to store data in all of the n memory cells 2110. Therefore, the u generating unit 1111 may generate the column vector u including n−s entries (s>t). For example, in the embodiment shown in FIG. 2, the u generating unit 1111 may select data corresponding to a column vector $u=[u_1\ u_2\ u_3\ u_4\ u_5]^T$ including five entries from among the input data DATA_IN and output the column vector u (s=3).

The G generating unit 1113 may generate the encoding matrix G. The encoding matrix G is an n×n matrix including n rows and n columns and may be used for generating a column vector v. The G generating unit 1113 may receive signals from the w generating unit 1112, generate a new encoding matrix G based on the signals, and output the new encoding matrix G. The G generating unit 1113 may generate an encoding matrix G randomly or pseudo-randomly. For example, the G generating unit 1113 may generate an encoding matrix G by combining at least one from among matrixes stored in a memory randomly or pseudo-randomly. Detailed descriptions thereof will be given below.

The w generating unit 1112 may receive the stuck cell information SC_INFO from the stuck cell information storing unit 1300, may receive the column vector u from the u generating unit 1111, and may receive the encoding matrix G from the G generating unit 1113. A column vector w generated by the w generating unit 1112 is auxiliary data based on stuck cells included in the cell array 2100, where the column vector w may be added to the column vector u generated by the u generating unit 1111 and may be used for generating the column vector v. The column vector w generated by the w generating unit 1112 may be expressed as $w=[w_1 \ldots w_s]^T$. The s entries $w_1$ through $w_s$ included in the column vector w may be determined based on the column vector u, the information α, the information μ, and the encoding matrix G that are received by the w generating unit 1112. If the w generating unit 1112 is unable to determine s entries $w_1$ through $w_s$ based on the column vector u, the information α, the information μ, and the encoding matrix G, the w generating unit 1112 may receive a new encoding matrix G from the G generating unit 1113 and determine s entries $w_1$ through $w_s$ by using the new encoding matrix G. Furthermore, the w generating unit 1112 may generate and output a label for the encoding matrix G used for generating the column vector w. The label is for the decoder 1200 to recognize the encoding matrix G used by the encoder 1100.

The v generating unit 1114 may receive the column vector u from the u generating unit 1111 and may receive the column vector w from the w generating unit 1112. Furthermore, the v generating unit 1114 may receive the encoding matrix G used by the w generating unit 1112 to generate the column vector w from the w generating unit 1112. The v generating unit 1114 may generate the codeword DATA_CW by using the column vectors u and w and the encoding matrix G, where the codeword DATA_CW may be expressed as a column vector $v=[v_1 \ldots v_n]^T$. In detail, the v generating unit 1114 may generate a column vector x by concatenating the column vector w with the column vector u and may generate the column vector v by multiplying the encoding matrix G by the column vector x.

The header generating unit 1115 may receive the label of the encoding matrix G and s from the w generating unit 1112 and may generate the header DATA_HD. The header DATA_HD generated by the header generating unit 1115 may include information required for the decoder 1200 to decode the codeword DATA_CW, and the decoder 1200 may decode the codeword DATA_CW by using the information included in the header DATA_HD. For example, the decoder 1200 may recognize the encoding matrix G used for encoding the codeword DATA_CW based on the label of the encoding matrix G included in the header DATA_HD and may generate a column vector x' by multiplying the codeword DATA_CW by an inverse matrix of the encoding matrix G. Furthermore, the decoder 1200 may extract a column vector u' included in the column vector x' by using s and may restore data based on the column vector u'. The header DATA_HD generated by the header generating unit 1115 may be stored in a storage space accessible by the encoder 1100 and the decoder 1200 separately from the codeword DATA_CW. For example, the header DATA_HD may be stored in a storage space included in the memory controller 1000 or a cell array included in the memory device 2000.

FIG. 4 is a diagram showing operation of the encoder 1100 according to an example embodiment of inventive concepts as equations. Referring to FIGS. 1 through 3, the u generating unit 1111 may generate a column vector u having n−s entries, the G generating unit 1113 may generate an n×n encoding matrix G, and the w generating unit 1112 may generate a column vector w having s entries. The v generating unit 1114 may generate a column vector v having n entries. As shown in FIG. 4, a column vector x having n entries may be formed by concatenating the column vector w having s entries with the column vector u having n−s entries. The column vector v may be calculated by multiplying the encoding matrix G by the column vector x.

As shown in FIG. 4, the n×n encoding matrix G may include a n×s first encoding matrix $G_1$ and a n×(n−s) second encoding matrix $G_2$. In the multiplication of the encoding matrix G by the column vector x, the first encoding matrix $G_1$ may correspond to the column vector w, whereas the second encoding matrix $G_2$ may correspond to the column vector u. Therefore, as shown in FIG. 4, the column vector v may be calculated by adding a multiplication of the first encoding matrix $G_1$ by the column vector w to a multiplication of the second encoding matrix $G_2$ by the column vector w. A column vector y refers to the multiplication of the first encoding matrix $G_1$ by the column vector w and may be expressed as $y=[y_1 \ldots y_n]^T$.

FIG. 5 is a diagram for describing operation of the w generating unit 1112 according to an example embodiment of inventive concepts. In the example embodiment shown in FIG. 2, the cell array 2100 may include the eight memory cells 2110, the memory cells 2110 corresponding to the coordinates 2 and 5 from among the memory cells 2110 may be stuck cells ($\alpha=\{2, 5\}$), and the stuck cells may have values of 0 and 1, respectively ($\mu=\{0, 1\}$). Therefore, a column vector v corresponding to data to be stored in the cell array 2100 may be expressed as $v=[v_1\ 0\ v_3\ v_4\ 1\ v_6\ v_7\ v_8]^T$. As shown in FIG. 5, the encoding matrix G is a 8×8 matrix (n=8), and a column vector x may be a concatenation of a column vector w having three entries and a column vector u having five entries (s=3). The u generating unit 1111 may generate the column vector $u=[1\ 1\ 1\ 0\ 1]^T$ having five entries from the input data DATA_IN. Furthermore, the encoding matrix G may be a combination of a 8×3 first encoding matrix $G_1$ and a 8×5 second encoding matrix $G_2$, where the first encoding matrix $G_1$ and the second encoding matrix $G_2$ may include entries of which values are 0 or 1.

According to an example embodiment of inventive concepts, a linear equation including entries $w_1$ through $w_s$ of the column vector w as variables may be induced from the entries included in rows of the encoding matrix G corresponding to coordinates of stuck cells and entries of the column vector x. Since there are t stuck cells, t linear equations may be induced. For example, as shown in FIG. 5, since the cell array 2100 of FIG. 2 includes stuck cells respectively corresponding to the coordinates of 2 and 5, two linear equations may be induced from entries included in the second row and fifth row of the encoding matrix G and entries of the column vector x. In detail, as shown in FIG. 5, a linear equation $w_3=0$ may be induced from a stuck cell whose coordinate is 2 and value is 0 and the second row of the encoding matrix G, whereas a linear equation $w_2=0$ may be induced from a stuck cell whose coordinate is 5 and value is 1 and the fifth row of the encoding matrix G. Therefore, the column vector w may be either $[0\ 0\ 0]^T$ or $[1\ 0\ 0]^T$.

According to an example embodiment of inventive concepts, the w generating unit 1112 may calculate s roots satisfying t linear equations and generate a column vector w by employing the roots as entries of the column vector w. Therefore, the column vector w may include information regarding stuck cells in relation to the column vector n generated by the u generating unit 1111. Meanwhile, if the w generating unit 1112 is unable to calculate s roots satisfying t linear equations or s roots satisfying t linear equations do not exist, the w generating unit 1112 may receive a new encoding matrix G from the G generating unit 1113.

FIG. 6 is a diagram for describing operations of the v generating unit 1114 and the decoder 1200 according to an example embodiment of inventive concepts. According to an example embodiment of inventive concepts, the decoder 1200 may receive a column vector v' based on data stored in the cell array 2100. The decoder 1200 may determine an inverse matrix $G^{-1}$ of the encoding matrix G based on the label of the encoding matrix G included in the header DATA_HD and may generate a column vector x' by multiplying the inverse matrix $G^{-1}$ by the received column vector v'. Furthermore, the decoder 1200 may extract a column vector u' having n−s entries from the column vector x' based on s included in the header DATA_HD.

Referring to FIGS. 5 and 6, if the w generating unit 1112 generates a column vector $w=[1\ 0\ 0]^T$ according to the embodiment shown in FIG. 5, the v generating unit 1114 may generate a column vector $v=[1\ 0\ 1\ 0\ 1\ 1\ 0\ 1]^T$ as shown in FIG. 6. The cell array 2100 may store data according to the column vector v. When the column vector v generated by the encoder 1100 is stored in the cell array 2100 and the decoder 1200 receives a column vector v' according to the data, the condition v'=v may be satisfied. As shown in FIG. 6, the decoder 1200 may generate a column vector x' by multiplying the inverse matrix $G^{-1}$ of the encoding matrix G by the column vector v' and may generate a column vector u' by extracting lower five entries from among entries of the x'.

When the encoder 1100 and the decoder 1200 perform the operations described above with reference to FIGS. 5 and 6, encoding operation may have a complexity of $O(n^2+s\cdot t^2)$ regarding an arbitrary encoding matrix G, whereas decoding operation may have a complexity of $O(n^2)$. Furthermore, the encoding matrix G and the inverse matrix $G^{-1}$ of the encoding matrix G may be stored in memories respectively accessible by the encoder 1100 and the decoder 1200 and may be recognized via labels. According to an example embodiment of inventive concepts, if the encoding matrix G is generated as a sparse random matrix, the complexity may be lowered, and capacities of the memories for storing the encoding matrix G and the inverse matrix $G^{-1}$ of the encoding matrix G may be adjusted.

FIG. 7 is a diagram showing an encoding matrix G according to an example embodiment of inventive concepts. As shown in FIG. 7, the encoding matrix G may include a n×s first encoding matrix $G_1$ and a n×(n−s) second encoding matrix $G_2$, where the first encoding matrix $G_1$ may include a s×s matrix $G_{11}$ and a (n−s)×s matrix $G_{21}$. Furthermore, the second encoding matrix $G_2$ may include a zero matrix $0_{s\times(n-s)}$ and a unit matrix $I_{(n-s)\times(n-s)}$. According to an example embodiment of inventive concepts, if the encoding matrix G is generated as shown in FIG. 7, the inverse matrix $G^{-1}$ of the encoding matrix G may have the same second encoding matrix $G_2$ and a different first encoding matrix $G_1$ as compared to the encoding matrix G. In other words, as shown in FIG. 7, the inverse matrix $G^{-1}$ of the encoding matrix G includes the second encoding matrix $G_2$ as-is and includes n×s matrix which is a combination of the inverse matrix $G_{11}^{-1}$ of the matrix $G_{11}$ and $-G_{21}\cdot G_{11}^{-1}$, instead of the first encoding matrix $G_1$. Therefore, a memory for storing the encoding matrix G may store the (n−s)×s matrix $G_{21}$, the s×s matrix $G_{11}$, and the inverse matrix $G_{11}^{-1}$ of the matrix $G_{11}$ instead of storing the n×n matrix G and the inverse matrix $G^{-1}$ of the encoding matrix G, and thus capacity of the memory may be reduced.

FIGS. 8A through 8C are diagrams showing encoding matrixes G according to example embodiments of inventive concepts. The encoding matrixes G shown in FIGS. 8A through 8C may include the second encoding matrix $G_2$ may include a zero matrix $0_{s\times(n-s)}$ and a unit matrix $I_{(n-s)\times(n-s)}$, as shown in FIG. 7.

FIG. 8A is a diagram showing the encoding matrix G including a first encoding matrix $G_1$ including a combination of the unit matrix $I_{s\times s}$ and the (n−s)×s matrix $G_{21}$ (first combination). If the matrix $G_{11}$ of FIG. 7 is the unit matrix $I_{s\times s}$ as shown in FIG. 8A, the encoding matrix G may be identical to the inverse matrix $G^{-1}$ of the encoding matrix G. Therefore, the encoder 1100 and the decoder 1200 may share a memory in which, the (n−s)×s matrix $G_{21}$ is stored, thereby saving memory space for storing the encoding matrix G.

Referring to FIGS. 3 and 8A, the G generating unit 1113 may generate the (n−s)×s matrix $G_{21}$ randomly or pseudo-randomly. According to the (n−s)×s matrix $G_{21}$ generated by the G generating unit 1113, the w generating unit 1112 may calculate s roots of t linear equations and generate a column vector w. However, if the w generating unit 1112 is unable to calculate s roots from t linear equations, the w generating unit 1112 may receive a new (n−s)×s matrix $G_{21}$ randomly or pseudo-randomly generated by the G generating unit 1113 and may obtain new t linear equations. For example, the possibility that the value of an entry of the (n−s)×s matrix $G_{21}$ becomes 1 is ½, and the (n−s)×s matrix $G_{21}$ may include independently and identically distributed (i.i.d.) entries having values of 0 or 1. Referring to Lemma 1 below, the possibility for the w generating unit 1112 to calculate s roots from t linear equations and generate a column vector w is $1-2^{t-s}$.

Lemma 1.
- (i) Let $1 \leq t < s$ and let V be a t×s random matrix whose entries are sampled independently and identically distribute (i.i.d.) from $Z_2$ (where $Z_2$ is a field or set having two Integers, 0 and 1) with probability ½ per entry to be 1. It then holds that the probability that V's row are linearly dependent is bounded from above by
- (ii) For $1 \leq k \leq t < s$ let V be a t×s matrix and let $(v_1, \ldots, v_t)$ be V's rows. Suppose that $(v_1, \ldots, v_k)$ are linearly independent and that each component $v_i$, $t \geq i > k$ is sampled independently and identically distributed (i.i.d.) from $Z_2$ with probability ½ of being 1. It then holds that the probability that V's rows are linearly dependent is bounded from above by $2^{t-s}$ Proof. (i) Let $(v_1, \ldots, v_t)$ be V's rows. The event U that V's row are linearly dependent is a non-disjoint union of the events $U_\alpha$, $\alpha \subseteq [t]$, $\alpha \neq \emptyset$, that $v = \Sigma_{i \in \alpha} v_i = 0$. Note that each component of V has a ½ probability of being 1 and that the components are independent. It follows that $\Pr(v=0)=2^{-s}$. Since there are $2^t-1$ events $U_\alpha$, $\alpha \subseteq [t]$, a≠∅, the probability that they all occur is bounded from above by the union bound by: $(2^t-1) \cdot 2^{-s} < 2^{t-s}$.

(ii) In this case the event U that V's row are linearly dependent is a non-disjoint union of the events $U_\alpha$ that $v_\alpha = \Sigma_{i \in \alpha} v_i = 0$, where $\alpha \subseteq [t]$, and a is not a subset of [k]. Here too each component of $v_\alpha (\alpha \subseteq [t], \alpha \subset [k])$ has a ½ probability of being 1 where the components are independent, which implies $\Pr(v_\alpha = 0) = 2^{-s}$. Since there are $2^t - 2^k$ events $U_\alpha$, $\alpha \subseteq [t]$, $\alpha \subset [k]$, the probability that they all occur is bounded from above by $2^{t-s}$.

FIG. 8B is a diagram showing a first encoding matrix $G_1$ generated by the G generating unit 1113 according to an example embodiment of inventive concepts. Referring to FIG. 7, according to an example embodiment of inventive concepts, the G generating unit 1113 may generate a second encoding matrix $G_2$ including a zero matrix $0_{s \times (n-s)}$ and a unit matrix $I_{(n-s) \times (n-s)}$. Furthermore, the G generating unit 1113 may generate a first encoding matrix $G_1$ including a row vector r satisfying equations below.

$$1 \leq t \leq s' < s \leq n/2 (s': \text{even})$$

$$d = s - s'$$

$$e_i = [0 \ 1_i \ 0_s] (0 < i < s)$$

$$q = [0_{1-s'} \ q_{s'+1} \ldots q_s]$$

$$r = e_i + e_j + q (1 \leq i \leq s'/2 \text{ and } ((s'/2)+1) \leq j \leq s')$$

where e is a row vector, q is a row vector and r is a row vector at uniform probability In other words, according to an example embodiment of inventive concepts, a row of the first encoding matrix $G_1$ generated by the G generating unit 1113, may include a row vector in which value of only one entry from among entries of which indexes are from 1 to s'/2 is 1 and value of only one entry from among entries of which indexes are from s'/2+1 to s' is 1. In other words, as shown in FIG. 8B, when s=14 and s'=10, the second row of the first encoding matrix $G_1$ may be a row vector r, which is the sum of row vectors $e_3$, $e_s$, and q.

Meanwhile, the G generating unit 1113 may generate the row vector r at a uniform probability in the probability space. In other words, the probability that a value of each of entries of the row vector r of which indexes are from 1 through s'/2 becomes 1 may be 1/(s'/2), whereas the probability that a value of each of entries of the row vector r of which indexes are from s'/2+1 through s' becomes 1 may be 1/(s'/2), independent from the probability regarding the entries of the row vector r of which indexes are from 1 through x'/2. Furthermore, the probability that a value of each of entries of the row vector r of which indexes are from s'+1 through s becomes 1 may be ½, independent from one another. The row vector r in the probability space $(\Omega, P)$ may be expressed as shown below, where the first encoding matrix $G_1$ may include the row vector r sampled to be independent and identically distributed from the probability space $(\Omega, P)$.

$$\Omega = \{r = e_i + e_j + q: 1 \leq i \leq s'/2 \text{ and } ((s'/2)+1) \leq j \leq s'\}$$

P is a uniform probability and $\Omega$ is a set of possible outcomes.

From among n row's of the first encoding matrix $G_1$, if t rows corresponding to coordinates of stuck cells are not linearly dependent on one another, a column vector w may be generated from an encoding matrix G based on the first encoding matrix $G_1$. In other words, since entries included in the t rows of the first encoding matrix $G_1$ are coefficients regarding s variables in t linear equation, there may be s roots satisfying the t linear equations if the t rows are not linearly dependent on one another. Therefore, when a t×s matrix including a row vector r sampled to be independent and identically distributed from the probability space $(\Omega, P)$ is referred to as a matrix V, the possibility that rows of the matrix V become linearly dependent on one another may be adjusted as desired based on the Lemmas below, Lemma 2. Let M, K ≥ 1. Denote the M dimensional unit vectors by: $e_i = [0, \ldots i-1 \text{ times} \ldots, 1, 0, \ldots, ]^T$ and $E_M = \{e_i : i \in [M]\}$
- (i) Let $i(1), \ldots, i(K) \in [s]$ than the sequence of vectors $(e_{i(k)})_{k \in [K]}$ is linearly dependent if there exists $k, k' \in [K]$ $k \neq k'$ such that $e_{i(k)} = e_{i(k')}$.

Define:
$V_K = \{[u_1, \ldots, u_K]: \text{for } k \in [K], u_k \in E_M\}$
$U_K = \{[u_1, \ldots, u_K] \in V_K: u_1 + \ldots + u_K = 0\}$ It then holds that:
- (ii) $|V_K| = M^K$
- (iii) If K is odd $U_K = \emptyset$
- (iv) If K is even, then $|U_K| \leq M^{K/2} \cdot (K-1) \cdot (K-3) \cdot, \ldots, \cdot 1 \leq M^{K/2} \cdot (K1)^{1/2}$
- (v) If K is even, then $|U_K| \geq M(M-1) \cdot \ldots \cdot (M-K/2+1) \cdot (K-1) \cdot (K-3) \cdot, \ldots, \cdot 1$
- (vi) If we sample with uniform probability an element $[u_1, \ldots, u_K] \in V_K$ (K even) than the probability of zero sum is bounded from above by:

$$\Pr(u_1 + \ldots + u_K = 0) \leq M^{-K/2} \cdot (K-1) \cdot (K-3) \cdot, \ldots, \cdot 1 = f(M, K)$$

- (vii) If we sample with uniform probability an element $[u_1, \ldots, u_K] \in V_K$ (K even) than the probability of zero sum is bounded from below by;

For example
for K=2: $\Pr(u_1 + u_2 = 0) \leq M^{-1}$
for K=4: $\Pr(u_1 + u_2 + u_3 + u_4 = 0) \leq M^{-2} \cdot 3$
for K=6: $\Pr(u_1 + u_2 + u_3 + u_4 + u_5 + u_6 = 0) \leq M^{-3} \cdot 15$ Proof of lemma 2: I. (i) & (ii) are trivial. To prove (iii) note firstly that it holds for K=1, let K>1 be odd and suppose inductively that for all odd K', $1 \leq K' < K$ and all $[u_1, \ldots, u_{K'}] \in V_{K'}: u_1 + \ldots + u_{K'} \neq 0$. Take $[u_1, \ldots, u_K] \in V_K$ and suppose to get a contradiction that $[u_1 + \ldots + u_K = 0$. Note that there must be some k>1 such that $u_1=u_k$, which implies that $u_1+u_k=0$ and hence $u_2+\ldots+u_{k-1}+u_{k+1}+\ldots+u_{K-1}=0$ which contradicts the induction assumption.

To prove (iv) we would construct for every element $u=[u_1,\ldots,u_K]\in U_K$ a 1:1 mapping $\phi=\phi_u:[K]\to[K]$ defined inductively, which has the following properties, for all $a\in[K]$:

$u_a=u_{\phi(a)}$
$\phi(a)\neq a$
$\phi(\phi(a))=a$

Such mapping is called pairing, for obvious reason, $\phi$ is defined inductively as follows. For k=1 let $\phi(1)$ be the minimal index in $\{2,\ldots,K\}$ such that $u_1=u_{\phi(1)}$. Define $\phi(\phi(1))=1$ and let $b_1=1$. Suppose inductively that after the r step, r<K/2 there is subset $A_r\subseteq[K]$, with $|A_r|=2r$ on which we defined a 1:1 mapping $\phi:A_r\to A_r$ such that for all $a\in A$ the above 3 properties holds $u_a=u_{\phi(a)}$
$\phi(a)\neq a$
$\phi(\phi(a))=a$ Note that $\Sigma_{a\in A_r}u_b=0$ and hence for $B=[K]\setminus A_r$:
$\Sigma_{b\in B}u_b=0$.

For the r+1 step let $b=b_r$ be the minimal element in B and let b' be the minimal element in $B\setminus\{b\}$ such that $u_b=u_{b'}$, and define $\phi(b)=b'$ and $\phi(b')=b$. Set $A_{r+1}=A_r\cup\{b,b'\}$, it is clear that the induction assumption carries to r+1 and hence the final $\phi$ satisfies the requirements (a)-(c). We will now be interested in the mapping $u\to\phi_u$ where $u=[u_1,\ldots,u_K]\in U_K$.

Let $F=\{\phi_u:u\in U_K\}$. The number of such pairings—$|F|$—is found via the following combinatorial observation: K–1 possibilities for $\phi(b_1)$ and independent K–3 possibilities for $\phi(b_2)$ and independent K–5 possibilities for $\phi(b_3)$, .... It follows that:

$|F|=(K-1)\cdot(K-3)\cdot(K-5)\cdot\ldots\cdot 1$

For each $\phi\in F$ define $U_{K,\phi}=\{:u\in U_K:\phi_u=\phi\}$.

Note that $U_K$ is a disjoint union of $U_{K,\phi}$, $\phi\in F$. There are at most $M^{K/2}$ elements in $U_{K,\phi}$ which is all the possible ways to choose $b_1,\ldots,b_r$ and hence $|U_K|\leq M^{K/2}\cdot(K-1)\cdot(K-3)\cdot,\ldots,\cdot 1$ ◆

Lemma 3: For $k\geq 1$ if $u_1,\ldots,u_k$ are sampled independently from $(\Omega,P)$ and $u=u_1+\ldots+u_k$ than If k is odd $u\neq 0$
If k is even $Pr(u=0)\leq(2/s')^k\cdot[(k-1)\cdot(k-3)\cdot,\ldots,\cdot 1]^2\cdot 2^{-d}$
$\leq(2/s')^k\cdot k1\cdot 2^{-d}$ Define: $q_k=(2/s')^k\cdot[(k=1)\cdot(k-3)\cdot,\ldots,\cdot 1]^2$, note that $q_2=(2/s')^2$ Proof: Let $T_i:F^s\to F^{s'/2}$ i=1,2 and be projections, defined for $w=[w_1,\ldots,w_s]^T\in F^s$ by:

$T_1(w)=[w_1,\ldots,w_{s'/2}]^T\in F^{s'}$
$T_2(w)=[w_{s'/2+1},\ldots,w_{s'}]^T\in F^{s'}$
$T_3(w)=[w_{s'+1},\ldots,w_s]^T\in F^d$ Take $u_1,\ldots,u_K$ which are sampled independently from $(\Omega,P)$ and let $u=u_1+\ldots+u_K$ than the above mention independency of the three sector and the symmetry of the first 2 sectors yields that:

$Pr(T_1(u)=0)=Pr(T_2(u)=0)$ $Pr(T_3(u)=0)=2^{-d}$ $Pr(u=0)=Pr(T_1(u)=0)\cdot Pr(T_2(u)=0)\cdot Pr(T_3(u)=0)=Pr(T_1(u)=0)^2\cdot 2^{-d}$.

To assess the probability of the event $(T_1(u)=0)$ we go back to lemma a2 that says: if we sample K unit vectors $[u_1,\ldots,u_K]$ of $F^M$ independently and identically distribute (i.i.d.) with uniform probability then $Pr(u_1+\ldots+u_K=0)\leq M^{-K/2}\cdot(K-1)\cdot(K-3)\cdot,\ldots,\cdot 1$ and $Pr(u_1+\ldots+u_K=0)\geq M^{-K}\cdot M(M-1)\cdot,\ldots,\cdot(M-K/2+1)\cdot(K-1)\cdot(K-3)\cdot,\ldots,\cdot 1$ It follows that:

$$Pr(T_1(u)=0)\leq(2/s')^{k/2}\cdot(k-1)\cdot(k-3)\cdot\ldots\cdot 1$$

$$Pr(T_1(u)=0)\geq(2/s')^k\cdot(s'/2)\cdot(s'/2-1)\cdot(s'/2-2)\cdot\ldots$$
$$(s'/2-k/2+1)\cdot(k-1)\cdot(k-3)\cdot\ldots\cdot 1=$$
$$(2/s')^k\cdot(s'/2)\cdot(s'/2-1)\cdot(s'/2-2)\cdot\ldots$$
$$(s'/2-k/2+1)\cdot(k-1)\cdot(k-3)\cdot\ldots\cdot 1$$

And hence $Pr(u=0)=Pr(T_1(u)=0)^2\cdot 2^{-d}\leq(2/s')^k\cdot((k-1)\cdot(k-3)\cdot,\ldots,\cdot 1)^2\cdot 2^{-d}$. ◆

Lemma 4. Recall that Set $1\leq t\leq s'\leq s\leq n/2$ and $s'+d=s$. Let V be a $t\times s$ random matrix whose rows are sampled independently and identically distribute (i.i.d.) from $(\Omega,P)$. It then holds that:

I. the probability $P_0$, that V's row are linearly dependent is bounded from above by:

$$P_0\leq 2^{-d}\cdot\sum_{1\leq k\leq t, k\text{ even}}\binom{t}{k}\cdot(2/s')^k\cdot k!$$

II Let $\gamma>0$ be a constant. If we add the assumption that $(1-\gamma)\cdot s'\geq 2\cdot t$ than:

$P_0\leq(2^{-d})/\gamma$.

Thus the failure probability can be arbitrarily small for $s=(2+\delta)\cdot t$ with $\delta>0$ as small as we wish.

Proof. I. Let $(v_1,\ldots,v_t)$ be V's rows, $v_i=(v_{ij})_{1\leq j\leq s}$ i=1,...,t. The event U that V's row are linearly dependent is a non-disjoint union of the events $U_\alpha$, $\alpha\subseteq[t]$, $\alpha\neq\emptyset$, that $\Sigma_{i\in\alpha}v_i=0$.

By lemma 2 above for $k\geq 1$ and $\alpha\subseteq[t]|\alpha|=k$:

If k is odd: $Pr(U_\alpha)=0$

If k is even: $Pr(U_\alpha)\leq(2/s')^k\cdot k1\cdot 2^{-d}$

Since $U=\cup_{\alpha\subseteq[t],\alpha\neq\emptyset}U_\alpha$ it holds by the union bound that:

$$Pr(U)\leq\sum_{\alpha\subseteq[t],\alpha\neq\emptyset}Pr(U_\alpha)=$$

$$\sum_{1\leq k\leq t,k\text{ even}}\sum_{\alpha\subseteq[t],|\alpha|=k}Pr(U_\alpha)=\sum_{1\leq k\leq t,k\text{ even}}\sum_{\alpha\subseteq[t],|\alpha|=k}Pr(U_\alpha)=$$

$$\sum_{1\leq k\leq t,k\text{ even}}\sum_{\alpha\subseteq[t],|\alpha|=k}(2/s')^k\cdot k!\cdot 2^{-d}=\sum_{1\leq k\leq t,k\text{ even}}\binom{t}{k}\cdot(2/s')^k\cdot k!2^{-d}$$

Define $$a_k=\binom{t}{k}\cdot(2/s')^k\cdot k!=t\cdot(t-1)\cdot\ldots\cdot(t-k+1)\cdot(2/s')^k$$

It then holds that $a_{k+1}/a_k=(t-k)\cdot 2/s'<2t/s'=1-\gamma$. So $$Pr(U) < 2^{-d} \cdot \sum_{1 \le k \le t} a_k \le 2^{-d} \cdot \sum_{1 \le k \le t} (1-\gamma)^k = 2^{-d}/\gamma \blacklozenge$$

Therefore, the possibility that it is unable to calculate s roots satisfying t linear equations may be reduced as desired by adjusting the δ>0.

FIG. 8C is a diagram showing an example of first encoding matrix $G_1$ generated by the G generating unit 1113 according to an example embodiment of inventive concepts. Referring to FIG. 7, according to an example embodiment of inventive concepts, the G generating unit 1113 may include a second encoding matrix $G_2$ including a zero matrix $0_{s\times(n-s)}$ and a unit matrix $I_{(n-s)\times(n-s)}$. Furthermore, the G generating unit 1113 may generate a first encoding matrix $G_1$ including a transposed matrix $H^T$ of a check matrix H for binary erasure channel (BEC) codes. For example, as shown in FIG. 8C, the first encoding matrix $G_1$ may include a transposed matrix of a s×n check matrix. The check matrix H is for checking errors in BEC codes, e.g., a low-density parity-check (LDPC) matrix, which is a sparse matrix.

According to an example embodiment of inventive concepts, an ε-failure-probability depends on a small header and the complexity of having to solve again t equations with, s unknowns in ε-probability. Reducing the computational complexity of both encoder and decoder for higher stucking probability p is accomplished by specially designed ensembles of sparse random $G_1$-matrices. A sparse matrix is a matrix which has a small number of nonzero elements at each row. More precisely the mean number of non-zero elements per row b bounded by a positive constant. It turns out, that the complexity of the decoder and the encoder (the linear system solver) are reduced.

There are several algorithms in this specification which allow a solution of a sparse linear system of t×s with O(t·s) operations. A well-known family of codes which are based on sparse matrices is referred to as low-density parity-cheek (LDPC) codes. It is known that those codes can achieve the capacity of many discrete memoryless channels (DMC) under maximum likelihood (ML) decoding.

In BEC, there are 3 symbols at the output of the channel: 0, 1 and erasure (E). The BEC is characterized by its erasure probability p>0, and it is denoted by BEC(p). For this channel, it is known that there exist codes which approach the BEC capacity: 1−p with linear decoding complexity.

SC capacity is also 1−p. There is another resemblance: the BEC decoder also tries to solve a linear system of t×s equations.

There is a fundamental difference between BEC and SC. The former requires an overdetermined full ranked system of linear equations (more equations than unknowns) to guarantee decoding, while the latter requires an underdetermined full ranked set of linear equations to guarantee encoding. Nevertheless, both share a common property: a failure occurs if the associated matrix is not full ranked. This led the inventors to investigate the possibility of some relation between the parity-check matrix of a BEC code and $G_1$ of the generator matrix of SC.

We proved that encoding and decoding BEC(p) algorithms with s-failure-probability can be translated into dual, encoding and decoding SC(p) algorithms with the same complexity and rate and same ε-failure-probability. The proof is presented in the sequel. The significance of this duality result is that the 1−p capacity of the SC(p) channel can be approached with, linear complexity encoding and decoding algorithms. In other words the above s and t (t the number of stuck cells s is the SC redundancy, s>t) can be chosen (in long enough codeword) with s/t close to 1.

Consider now BEC and a linear code C with code words of length n, where C has the ability to correct t erasures in probability 1−ε. The code C can be represent by an s×n parity check matrix, H, s>t. Let now y=A·x depict a linear system that is needed to be solved in a BEC decoding scheme with t erasures. Thus A is an s×t sub-matrix is of H composed of the t H-columns which correspond to the positions of the erased bits.

In BEC decoding, the iterative algorithm searches for a row with a single one (the $j^{th}$ row, where the $i^{th}$ position is 1, for example), solve its associated unknown immediately ($x_i$), and then substitute the solution in all the equations which involve $x_i$. This is equivalent to removing the $j^{th}$ row and $i^{th}$ column.

This process is continued until the entire matrix is diminished. If in some stage of the decoding no row with a single one was found—a decoding failure is declared. Good BEC codes has the property that for almost any set of t erasures, the above process succeeds, that is in any stage, until the linear system is solved, there is at least one row with a single 1 in it. It is known from the vast literature on BEC codes, that there exist codes that can achieve capacity using this simple, low linear complexity, algorithm. Unfortunately, we cannot apply this algorithm straightforwardly to our SC case, since there we deal with a transposed version of A. It is easy to prove that the probability to find a row with a single 1 in $A^T$ (a column with a single 1 In A) approaches 0 for good codes. We propose instead a decoding algorithm for SC, based on BEC-SC duality, which is composed of 2 steps. In the first step we use an iterative algorithm to turn $A^T$ into an upper triangular matrix. Then, in a second step, we solve the linear system using back-substitution method. In the first step only row and column permutations are done, hence the number of ones in $A^T$ stays the same. Thus, the number of operations in the second step is linear in t.

Iterative Triangulation, an outline of Algorithm that solves the linear system of equations y=A·x Input: sparse matrix A of size t×s, the vector y of size t.

Output: Upper triangular matrix A, rearrangement of the s-dimensional vector x rearrangement of the t-dimensional vector y.

Notation: Let 1 and J be sets of natural numbers. We denote by A[1,J] the sub-matrix of A which is composed by the rows indexed by 1 and the columns indexed by J.

Algorithm 1:

Initialization: Set n=1.

Steps:
1. Search for a column in A[n:t,n:s] with a single 1. Denote the column position, in A by i, and the (row) position of the 1 by j. In none was found→Declare an error
2. Swap between the $i^{th}$ and $n^{th}$ columns of A. Swap between the $i^{th}$ and $n^{th}$ elements of x
3. Swap between the $j^{th}$ and $n^{th}$ rows of A. Swap between the $j^{th}$ and $n^{th}$ elements of y
4. Set n=n+1
5. If n==t, proceed, else go to step 1
6. Set $A^\#=A$ $x^\#=x$ (# signifies the permuted matrix/vector)
End.

Back-Substitution

After the first decoding stage we have the linear equation, system $A^\# \cdot x^\# = y^\#$ where $A^\#$ is an upper triangular matrix. In the back-substitution stage we find $x^\#$ iterative, and hence also the original unknowns vector x.

Algorithm 2:
Initialization: Set $x_1^{\#}=0$ For $i \in \{t+1, t+2, \ldots s\}$, arbitrarily (any other initialization vector will also work). Fix n=t.
Steps:
  1. Compute; $x_n^{\#}=y_n^{\#}-\Sigma_{n+1 \leq i \leq t} a_{n,i}^{\#} \cdot x_i^{\#}$
  2. Set n=n−1
  3. If n=0, end successfully, else go to step 1

Computational Complexity

In order to take advantage of the large number of zero elements, special storage schemes are required to store sparse matrixes. Example of simple and efficient scheme to store an n×n sparse matrix which has at most r ones in a row, is to store an n×r matrix, where each row contains the column indices of the 1 elements in the original matrix row. For rows with less than, r nonzero elements, repetition of the last nonzero index should be filled in. Another version that can save storage space is to store the delta of the indexes.

The first decoding stage requires at most 2·(t−1) swap operations. The swap operation can be done without any change in the original matrix storage, by using two auxiliary memories of n elements each, one for column ordering and one for rows ordering. The content of the i-th memory element contains the index of the swapped (permuted) row (column).

The second decoding stage needs only a linear (in t) number of XOR operations, since the first stage do not change the number of ones in the matrix. To conclude, the suggested decoding algorithm is very simple and easy to implement in HW/SW.

According to an example embodiment of inventive concepts, when each row of the first encoding matrix $G_1$ include 3 nonzero elements, the encoding matrix G may satisfy the equation below (third combination). An encoding code according to the encoding matrix G satisfying the below equation enables transmission at rate of 1−1.21p (channel capacity is 1−p).

$$G=[G_1, G_2]=[G_{11}, 0_{s \times (n-s)}; G_{21}, I_{(n-s) \times (n-s)}] \in F^{n \times n}$$

The storage and manipulation of such a code is highly efficient due to the regularity of the code (no fill-ins are needed since any row contains exactly 3 ones). The second decoding stage requires only 3·t XOR operations.

Figure 9:
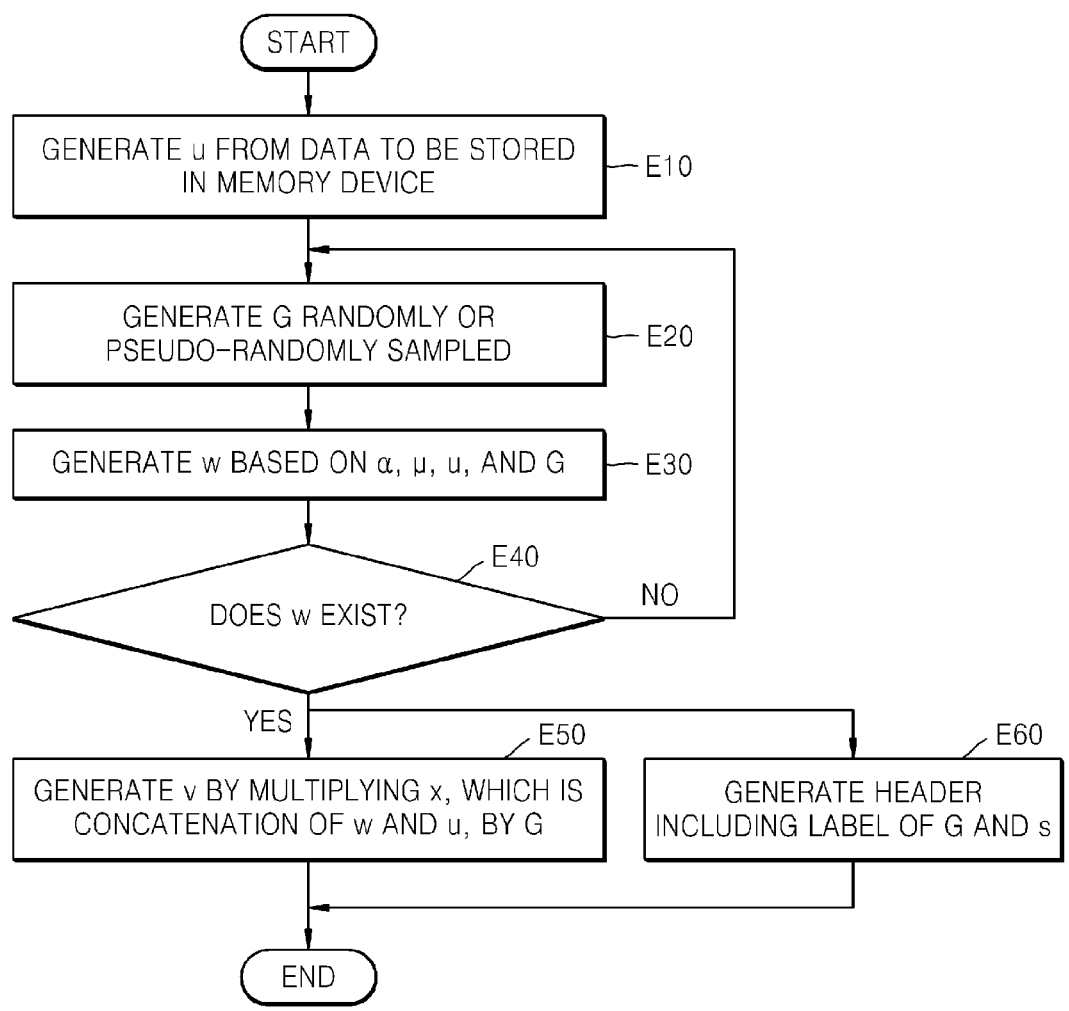
FIG. 9 is a flowchart showing an encoding method according to an example embodiment of inventive concepts.

FIG. 9 is a flowchart showing an encoding method according to an example embodiment of inventive concepts. An encoder for performing the encoding method according to an example embodiment of inventive concepts may generate codeword DATA_CW corresponding to data to be stored in a cell array in which n memory cells including t stuck cells are arranged.

As shown in FIG. 9, an encoder may generate a column vector including a n−s entries based on data to be stored in a memory device, in correspondence to data to be stored in a cell array including n memory cells (operation E10). The column vector u may be concatenated with a column vector w to be generated later, thereby forming a column vector x.

An encoder may generate an encoding matrix G, which is a n×n matrix, by combining at least one matrix that is generated randomly or pseudo-randomly (operation E50). For example, the encoder may generate the encoding matrix G as shown in FIG. 7. In other words, the encoder may generate a n×s first encoding matrix G1 and a n×(n−s) second encoding matrix G2 and may generate the encoding matrix G by combining the first encoding matrix G1 with the second encoding matrix G2. Here, the encoder may generate the second encoding matrix G2 by combining a zero matrix 0s×(n−s) and a unit matrix I(n−s)×(n−s).

The encoder may generate the column vector w having s entries based on the information α regarding coordinates of stuck cells, information μ regarding values of the stuck cells, the column vector u, and the encoding matrix G (operation E30). As described above with reference to FIG. 5, the encoder may obtain t linear equations based on the information α, the information μ, the column vector u, and the encoding matrix G and may calculate s roots satisfying the t linear equations as entries of the column vector w.

The encoder may determine that the encoder is unable to generate the column vector w based on the information α, the information μ, the column vector u, and the encoding matrix G (operation E40). For example, if the encoder is unable to calculate s roots satisfying the t linear equations, the encoder may determine that there is no column vector w corresponding to the information α, the information μ, the column vector u, and the encoding matrix G. If the encoder determines that there is no column vector w, the encoder may generate a new encoding matrix G by combining at least one matrix that is randomly or pseudo-randomly sampled (the operation E20).

If the encoder generates the column vector w, the encoder may generate a column vector x by concatenating the column vector w with the column vector u and may generate a column vector v having n entries by multiplying the encoding matrix G by the column vector x (operation E20). The encoding matrix G used for generating the column vector x may be identical to the encoding matrix G used for generating the column vector w in the operation E30. The column vector v generated by the encoder corresponds to data to be stored in a cell array including n memory cells, and entries of the column vector v respectively corresponding to t stuck cells may have values of the corresponding stuck cells, respectively.

If the column vector w is successfully generated, the encoder may generate a header including the label of the encoding matrix G used for generating the column vector w (or used for generating the column vector v) and s, which is the number of entries of the column vector w (operation E60). The header generated by the encoder may be stored in a storage space separate from a storage space in which data corresponding to the column vector v is stored, and a decoder may later access the storage space and determine the encoding matrix G of a column vector v' and s corresponding to data received from memory cells based on the header.

Figure 10:
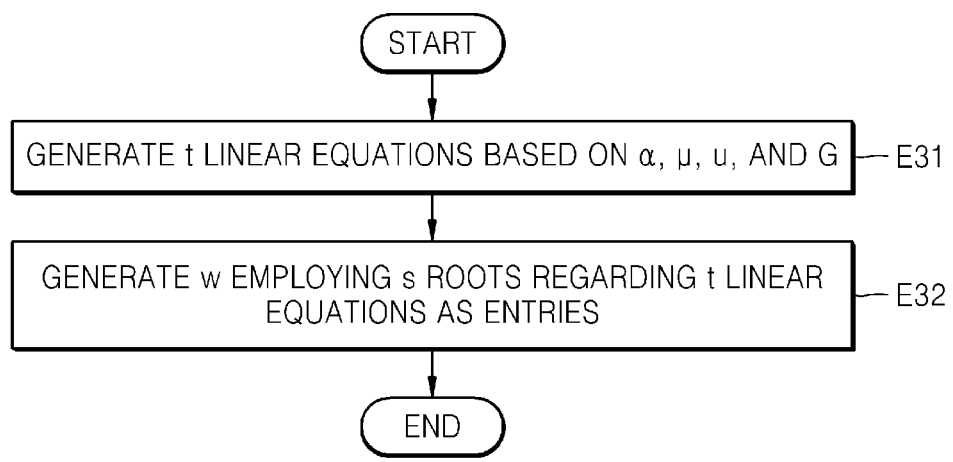
FIG. 10 is a flowchart showing a method of generating a column vector according to an example embodiment of inventive concepts.

FIG. 10 is a flowchart showing a method of generating a column vector w according to an example embodiment of inventive concepts. An encoder may obtain t linear equations by using information α, information μ, a column vector u, and an encoding matrix G (operation E31). The linear equations may include s entries of the column vector w as variables, entries included in rows of a first encoding matrix G1 corresponding to the information α as coefficients, and mathematically-calculated values of the information μ, the column vector u, and a second encoding matrix G2 as constants. As described above with reference to FIGS. 7 and 8A through 8C, the encoder may generate the second encoding matrix G2 by combining a zero matrix with a unit matrix and may generate the first encoding matrix G1 according to any of example embodiments of inventive concepts described above.

The encoder may calculate s roots satisfying t linear equations and generate a column vector w by employing the roots as entries of the column vector w (operation E32). Based on the encoding matrix G according to example embodiments of inventive concepts as described above, the encoder may calculate the s roots and generate the column vector w at low complexity.

Figure 11:
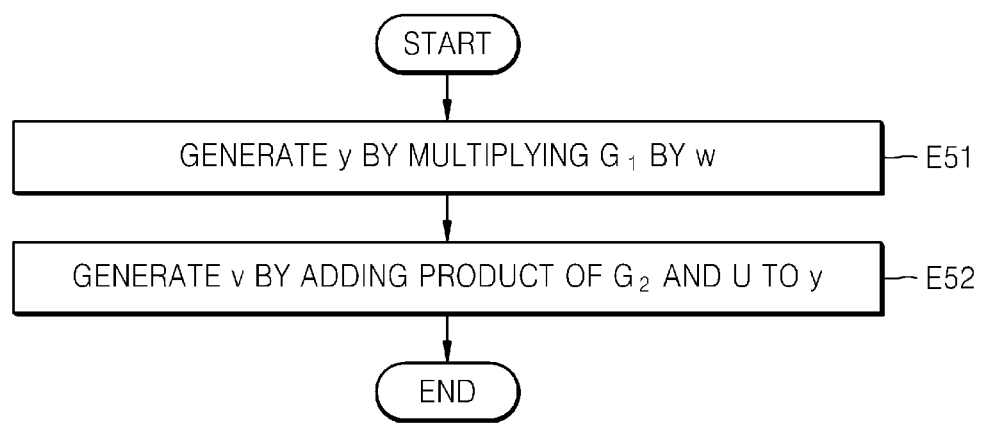
FIG. 11 is a flowchart showing a method of generating a column vector according to an example embodiment of inventive concepts.

FIG. 11 is a flowchart showing a method of generating a column vector v according to an example embodiment of inventive concepts. An encoder may generate a column vector y having n entries by multiplying a first encoding matrix G1 by a column vector w (operation E51). The encoder may generate a column vector v by adding the column vector y to a product of a second encoding matrix G2 and a column vector u (operation E52).

According to example embodiments of inventive concepts, the multiplication of the second encoding matrix G2 and the column vector u may have low complexity. For example, if the second encoding matrix G2 is a combination of a zero matrix and a unit matrix as shown in FIG. 7, the multiplication of the second encoding matrix G2 and the column vector u may be a column vector having n entries, which includes s zero entries and entries of the column vector u. In other words, without further mathematical calculation, the multiplication of the second encoding matrix G2 and the column vector u may be obtained based on arrangement of the column vector u.

Figure 12:
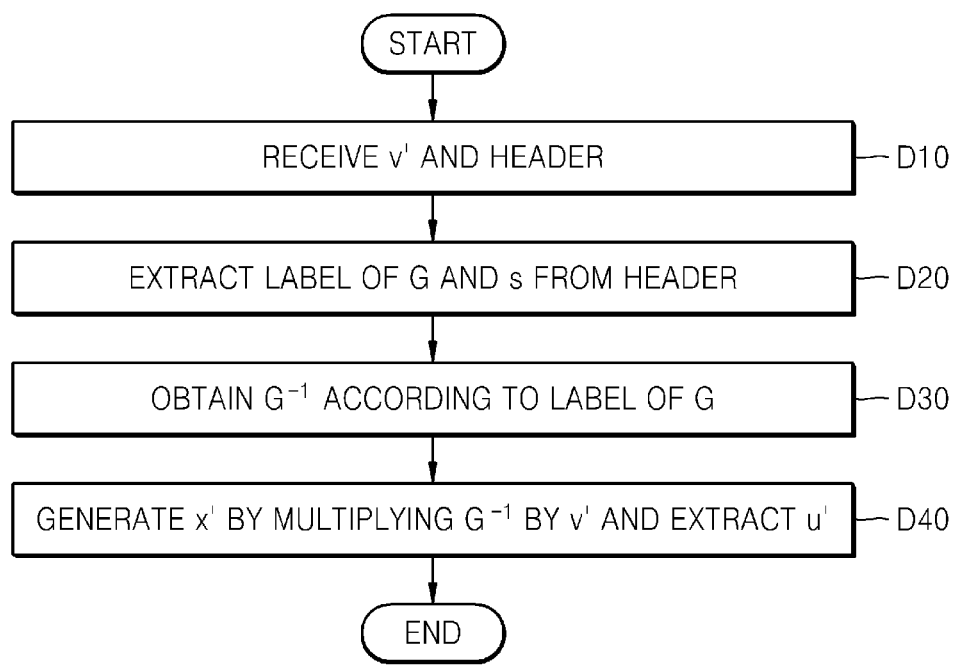
FIG. 12 is a decoding method according to an example embodiment of inventive concepts.

FIG. 12 is a decoding method according to an example embodiment of inventive concepts. The decoding method may be similar to a reverse of the encoding method described above with reference to FIG. 9. A decoder for performing the decoding method may use a column vector v' including n entries corresponding to data stored in a cell array including n memory cells and a header corresponding to the data as inputs and may output a column vector having (n−s) entries.

As shown in FIG. 12, a decoder may receive a column vector v' including n entries corresponding to data stored in a cell array and a header corresponding to the data (operation D10). The column vector v' may include values corresponding to stuck, cells as entries. The header may be separately stored in a storage space included in the memory controller 1000 of FIG. 1 or may be separately stored in a cell array included in the memory device 2000, where the decoder may receive the header from the storage space or the cell array in which the header is stored.

The header may include the label of an encoding matrix G used by an encoder to generate the column vector v' and may include s, which is the number of entries of the column vector w (operation D20). The decoder may obtain an inverse matrix G-1 of the encoding matrix G based on the label of the encoding matrix G included in the header (operation D30). For example, the decoder may access a memory in which the inverse matrix G-1 is stored based on the label of the encoding matrix G and read out the inverse matrix G-1. According, to the structure of the encoding matrix G, the inverse matrix G-1 may be identical or similar to the encoding matrix G.

The decoder may generate a column vector x' including n entries by multiplying the inverse matrix G-1 by the column vector v' and may generate a column vector u' by extracting (n−s) entries from the column vector x' (operation D40). The decoder or a component, following the decoder may restore data prior to being encoded by the encoder from the column vector u'.

Figure 13:
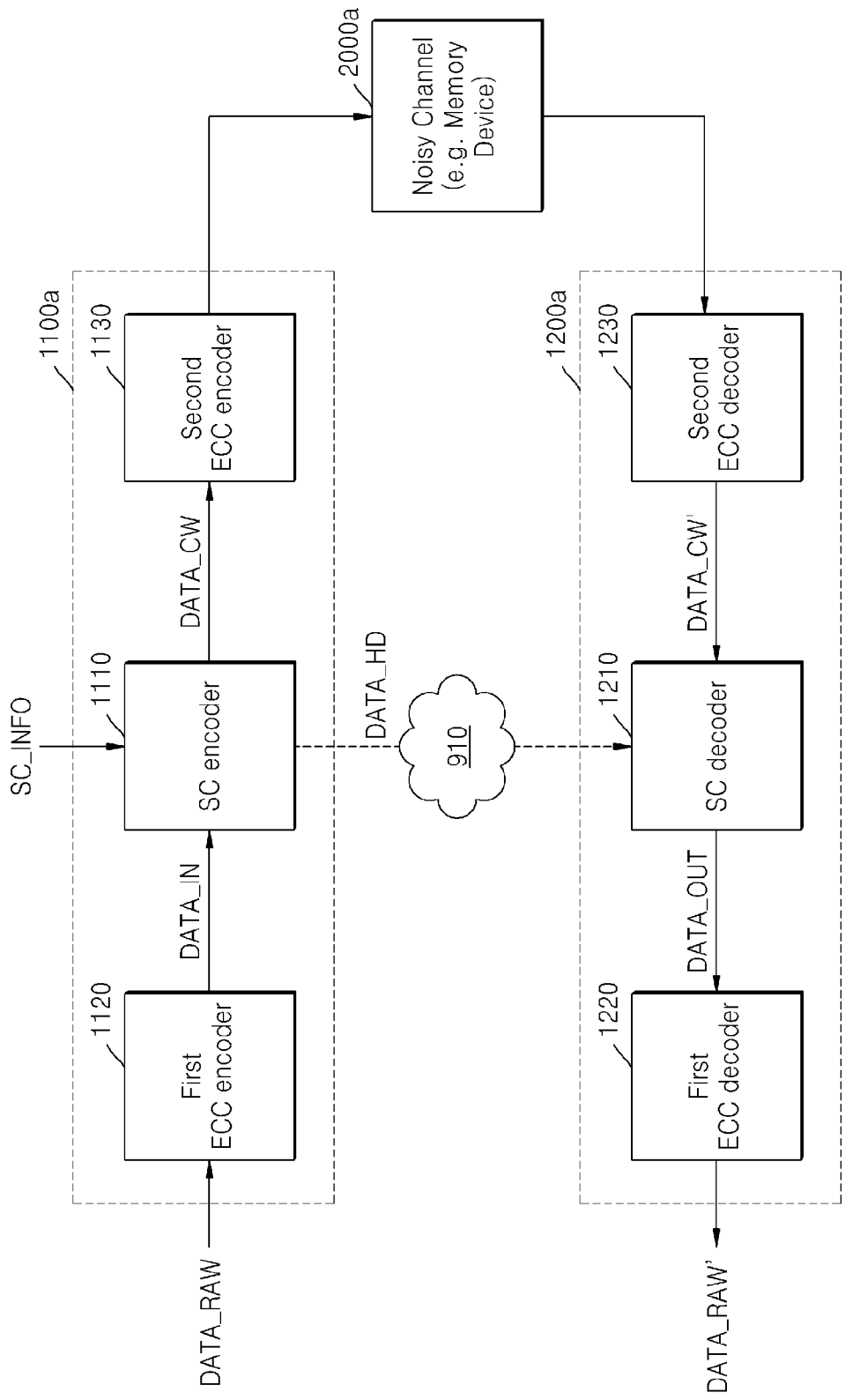
FIG. 13 is a schematic block diagram showing an encoder and a decoder according to an example embodiment of inventive concepts.

FIG. 13 is a schematic block diagram showing an encoder 1100a and a decoder 1200a according to an example embodiment of inventive concepts. According to an example embodiment of inventive concepts, the encoder 1100a may not only perform the operation described above with reference to FIG. 9, but also perform additional ECC encoding. Furthermore, according to an example embodiment of inventive concepts, the decoder 1200a may not only perform the operation described above with reference to FIG. 12, but also perform additional ECC decoding. In other words, an encoding method according to an example embodiment of inventive concepts may be used for encoding data output by another ECC encoder, and data generated by using the encoding method according to an example embodiment of inventive concepts may be encoded by another ECC encoder. Furthermore, a decoding method according to an example embodiment of inventive concepts may be used for decoding data output by another ECC decoder, and data generated by using the decoding method according to an example embodiment of inventive concepts may be decoded by another ECC encoder. As shown in FIG. 13, the encoder 1100a may include a SC encoder 1110 and first and second ECC encoders 1120 and 1130, whereas the decoder 1200a may include a SC decoder 1210 and first and second ECC decoders 1220 and 1230.

The first ECC encoder 1120 may receive raw data DATA_RAW from outside the encoder 1100a. The raw data DATA_RAW may include user data to be written to the memory system 900 by the host 800 of FIG. 1 and metadata generated by the memory controller 1000 to manage the user data. The first ECC encoder 1120 may encode the raw data DATA_RAW and output input data DATA_IN with respect to the SC encoder 1110.

According to an example embodiment of inventive concepts, the SC encoder 1110 may include the components shown in FIG. 3 and may perform the operations shown in FIG. 9. The SC encoder 1110 may perform an encoding method according to an example embodiment of inventive concepts based on input data DATA_IN and stuck cell information SC_INFO and output codeword DATA_CW and header DATA_HD.

The second ECC encoder 1130 may receive the codeword DATA_CW from the SC encoder 1110 and encode the codeword DATA_CW. Data encoded by the second ECC encoder 1130 may be transmitted to the decoder 1200a via a noise channel 2000a. The noise channel 2000a is a channel in which errors may occur between received data and transmitted data and may include a memory device and a cell array, for example. The second ECC decoder 1230 may receive data from the noise channel 2000a and output codeword DATA_CW by decoding the received data.

The second ECC encoder 1130 and the second ECC decoder 1230 may perform an encoding operation and a decoding operation, respectively, for correcting possible errors in the noise channel 2000a. According to an example embodiment of inventive concepts, the second ECC encoder 1130 and the second ECC decoder 1230 may perform an encoding operation and a decoding operation while information regarding stuck cells is maintained, so that errors regarding the stuck cells may be corrected.

According to an example embodiment of inventive concepts, the SC decoder 1210 may perform the operation shown in FIG. 12. The SC decoder 1210 may receive the codeword DATA_CW' and the header DATA_HD and generate output data DATA_OUT. The header DATA_HD is a header generated by the SC encoder 1110 when the input data DATA_IN is encoded, is stored in a separate storage space 910 in the memory system 900, and is transmitted to the SC decoder 1210. The first ECC decoder 1220 may receive the output data DATA_OUT from the SC decoder 1210, decode the output data DATA_OUT by using a decoding method corresponding to the encoding method sued by the first ECC encoder 1120, and output raw data DATA_RAW'.

The first ECC encoder 1120 and the first ECC decoder 1220 may perform an encoding operation and a decoding operation in correspondence to each other, whereas the second ECC encoder 1130 and the second ECC decoder 1230 may also perform an encoding operation and a decoding operation in correspondence to each other. For example, the ECC encoders 1120, 1130 and the ECC decoders 1220, 1230 may use LDPC.

Although FIG. 13 shows an example embodiment in which all ECC encoders and all ECC decoders are arranged around the SC encoder 1110 and the SC decoder 1210, the encoder 1100a and the decoder 1200a may include a pair of an encoder and a decoder corresponding to each other from among the ECC encoders and the ECC decoders stated above.

Figure 14:
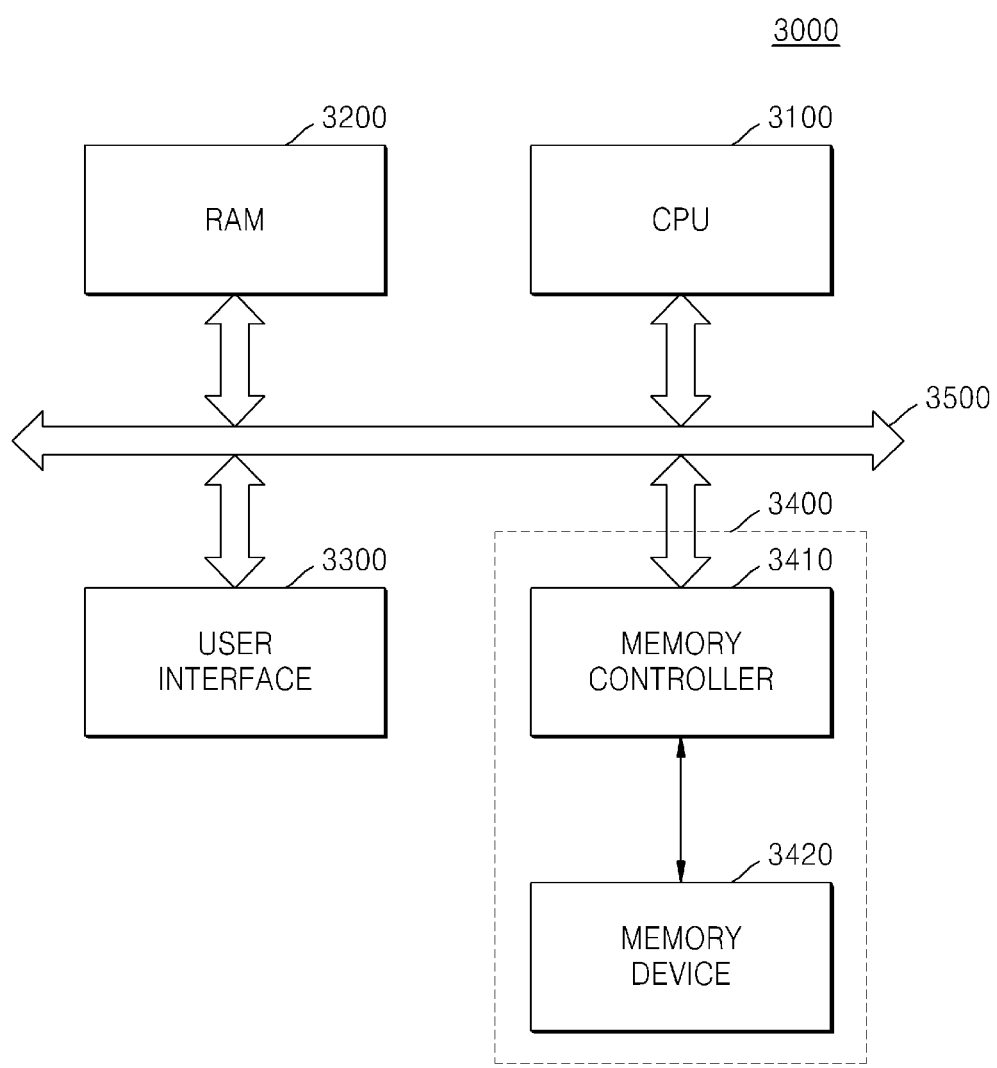
FIG. 14 is a block diagram showing a computer system including a memory system according to example embodiments of inventive concepts.

FIG. 14 is a block diagram showing a computer system 3000 including a memory system according to an example embodiment of inventive concepts. The computer system 3000, such as a mobile device, a desktop computer, and a server, may employ a memory system 3400 according to an example embodiment of inventive concepts.

The computer system 3000 may include a central processing unit 3100, a RAM 3200, a user interface 3300, and the memory system 3400, are electrically connected to buses 3500. The host as described above may include the central processing unit 3100, the RAM 3200, and the user interface 3300 in the computer system 3000. The central processing unit 3100 may control the entire computer system 3000 and may perform calculations corresponding to user commands input via the user interface 3300. The RAM 3200 may function as a data memory for the central processing unit 3100, and the central processing unit 3100 may write/read, data to/from the memory system 3400.

As in example embodiments of Inventive concepts described above, the memory system 3400 may include a memory controller 3410 and a memory device 3420. The memory controller 3410 may include an encoder, a decoder, and a stuck cell information storing unit, the memory device 3420 may include a cell array including a plurality of memory cells, and the cell array may include stuck cells. The encoder may receive information regarding stuck cells from the stuck cell information storing unit, encode data to be stored in the cell array, generate codeword, and generate a header corresponding to the codeword. The codeword generated by the encoder may include values of the stuck cells included in the cell array. The decoder may extract encoding information from the header and decode the data stored in the cell array based on the encoding information.

Figure 15:
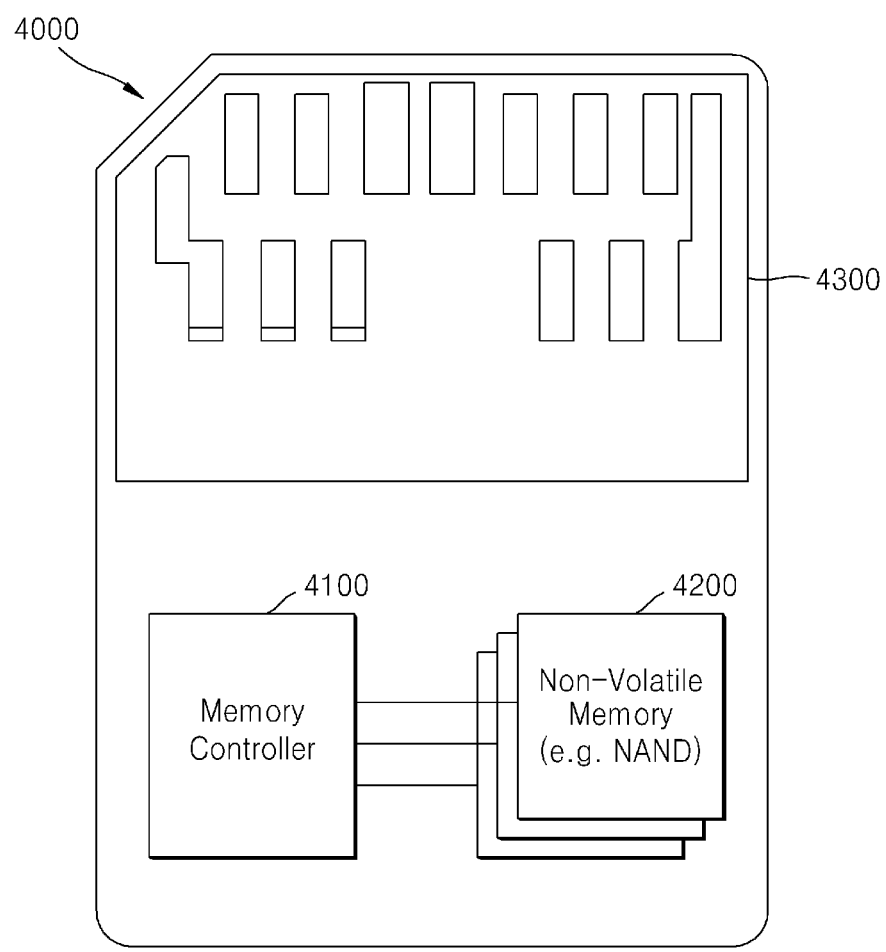
FIG. 15 is a block diagram showing a memory card according to an example embodiment of inventive concepts.

FIG. 15 is a block diagram showing a memory card 4000 according to an example embodiment of inventive concepts. A memory system according to example embodiments of inventive concepts described above may be the memory card 4000. For example, the memory card 4000 may include an embedded multimedia card (eMMC) or a secure digital (SD) card. As shown in FIG. 15, the memory card 4000 may include a memory controller 4100, a non-volatile memory 4200, and a port region 4300. A memory device according to example embodiments of inventive concepts may be the non-volatile memory 4200 shown in FIG. 15.

The memory controller 4100 may include an encoder, a decoder, and a stuck cell information storing unit according to example embodiments of inventive concepts as described above. The encoder and the decoder may perform an encoding method and a decoding method according to example embodiments of inventive concepts, whereas the stock cell information storing unit may store information regarding stuck cells included in the non-volatile memory 4200. The memory controller 4100 may communicate with an external host via the port region 4300 in compliance with a pre-set protocol. The protocol may be eMMC protocol, SD protocol, SATA protocol, SAS protocol, or USB protocol. The non-volatile memory 4200 may include memory cells which retain data stored therein even if power supplied thereto is blocked. For example, the non-volatile memory 4200 may include a flash memory, a magnetic random access memory (MRAM), a resistance RAM (RRAM), a ferroelectric RAM (FRAM), or a phase change memory (PCM).

Figure 16:
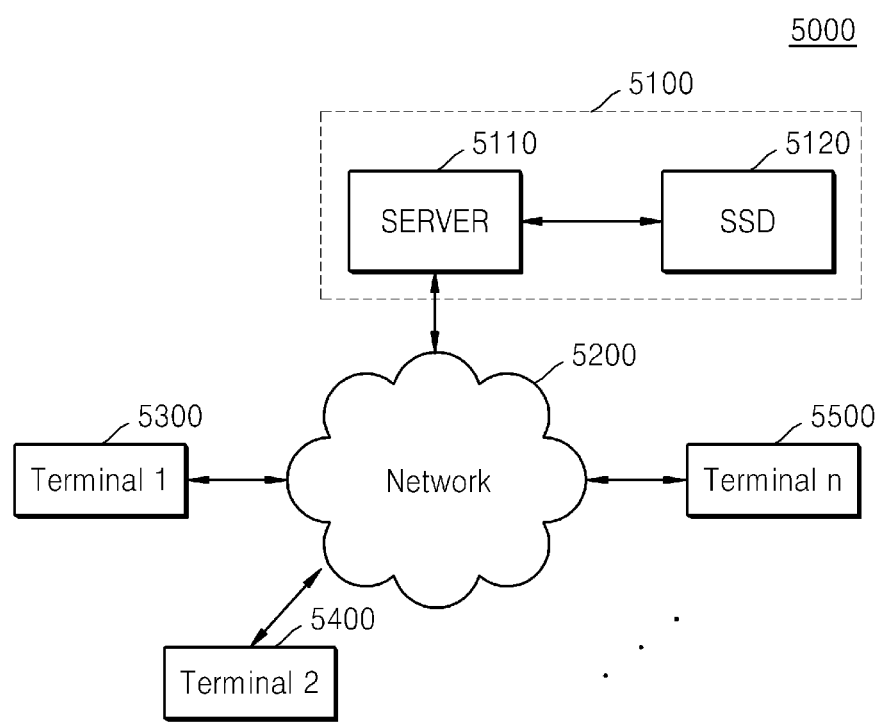
FIG. 16 is a block diagram showing an example network system including a memory system according to an example embodiment of inventive concepts.

FIG. 16 is a block diagram showing an example network system 5000 including a memory system according to an example embodiment of inventive concepts. As shown in FIG. 16, the network system 5000 may include a server system 5100 and a plurality of terminals 5300, 5400, and 5500 that are connected via a network 5200. The server system 5100 may include a server 5110 for processing requests received from the plurality of terminals 5300, 5400, and 5500 connected to the network 5200 and a SSD 5120 for storing data corresponding to the requests received from the terminals 5300, 5400, and 5500. Here, the SSD 5120 may be a memory system according to an example embodiment of inventive concepts.

Meanwhile, a memory system according to example embodiments of inventive concepts may be mounted via any of various packages. For example, a memory system according to an example embodiment of inventive concepts may be mounted via any of packages including package on package (PoP), ball grid arrays (BGAs), chip scale packages (CSPs), plastic leaded chip Carrier (PLCC), plastic dual in-line package (PDIP), die in waffle pack, die in wafer form, chip on board (COB), ceramic dual in-line package (CERDIP), plastic metricquad flat pack (MQFP), thin quad flatpack (TQFP), small outline (SOIC), shrink small outline package (SSOP), thin small outline (TSOP), thin quad flatpack (TQFP), system. In package (SIP), multi chip package (MCP), wafer-level fabricated package (WFP), wafer-level processed stack package (WSP), etc.

It should be understood that example embodiments described herein should be considered in a descriptive sense only and not for purposes of limitation. Descriptions of features or aspects within each embodiment should typically be considered as available for other similar features or aspects in other example embodiments.

Example Embodiments of the Fast Linear Equations Solution Used by the SC Encoder Introduction Let F be any field and m,n≥1. A matrix $A \in F^{n \times m}$ is called here C-sparse for some C>0 if the number of non-zero entries in A is upper bounded by C·n (though the reference to C will usually be omitted here). The goal of this section is low complexity algorithms that solves the set of linear equations $A \cdot x = y$ where $A \in F^{n \times m}$ is a sparse matrix, $x \in F^m$, $y \in F^n$ where x, y are column vectors. This goal is achieved by an algorithm that first diagonal be A and then (or simultaneously) it solves the set of linear equations.

Define for i,j∈[n], $E'_{i,j,n} \in F^{n \times n}$ to be the matrix whose entries are all zeros except for the (i,j) entry which is 1. Elementary matrix are matrix of the type $(I_{n \times n} + x \cdot E'_{p,q,n})$ and also simple permutation matrix whose product swaps 2 coordinates such as the matrix $$E = \begin{pmatrix} 0 & 1 & 0 \\ 1 & 0 & 0 \\ 0 & 0 & 1 \end{pmatrix}$$

This section reminds that every matrix $A \in F^{n \times m}$ can be diagonalized that is, decomposed (as is done in SVD with Householder matrix) as follows:

$$A = E_1^{-1} \cdot \ldots \cdot E_{N-1}^{-1} \cdot E_N^{-1} \cdot I_{k,n \times m} \cdot E'^{-1}_M \cdot E'^{-1}_{M-1} \cdot \ldots \cdot E'^{-1}_1.$$

Where $I_{k,n\times m}$ is diagonal with $(1,1,\ldots,1,0,\ldots 0)$ on the diagonal. It proposes a greedy algorithm that at each subroutine minimizes (in some sense) the field operations done by the algorithm. Each subroutine reduces the remaining matrix by one column and one row, that is reduces n and m by one. It is—at this point—hubristic procedure aimed at reducing (& nearly minimizing) field (F) operations for general sparse matrix Define:

$$M_{t,d,n,m} = \{A=(a_{i,j})_{i\in[n],j\in[m]} \in F^{n\times m}: \text{ for all } 1\leq i\leq n: |\{j\in[m-d]: a_{ij}\neq 0\}|\leq r\}.$$

This type of matrix with constant d correspond to our random coding and hence they are our main focus in the effort of developing fast algorithms that solves $A\cdot x = y$. At this point will show that that for $r=2$ there is an $O(n)$-complexity solution.

Left Product by Matrix of the Type $(I_{n\times n}+x\cdot E'_{p,q,n})$ is Equivalent to Adding a Scalar Product of a Row to Another Row Lemma 1: For $A=(a_{i,j})_{i\in[n],j\in[m]}\in F^{n\times m}$, $x\in F$ and $p,q\in[n]$, (i) $E'_{p,q,n}\cdot A=B=(b_{i,j})_{i\in[n],j\in[m]}$ where for $i\in[n], j\in[m]$: $b_{i,j}=\delta_{i,p}\cdot a_{q,j}$ ($\delta_{i,p}$ is Kronecker's $\delta$).

That is, B is the matrix whose rows are all zeros except for the p row that is equal to the q row of A.

(ii) $(I_{n\times n}+x\cdot E'_{p,q,n})\cdot A=C=(c_{i,j})_{i\in[n],j\in[m]}$ where for $i\in[n], j\in[m]$: $c_{i,j}=a_{i,j}+x\cdot\delta_{i,p}\cdot a_{q,j}$ ($\delta_{i,p}$ is Kronecker's $\delta$).

That is, C is the matrix whose rows are ail equal to A's row except for the p row that is equal to the p row of A plus x multiplied by the q row of A.

Right Product by Matrix of the Type $(I_{m\times m}+x\cdot E'_{p,q,m})$ is Equivalent to Adding a Scalar Product of a Column to Another Column Lemma 2: For $A=(a_{a,j})_{i\in[n],j\in[m]}\in F^{n\times m}$, $x\in F$ and $p,q\in[m]$, (i) $A\cdot E'_{p,q,m}=B=(b_{i,j})_{i\in[n],j\in[m]}$ where for $i\in[n], j\in[m]$: $b_{i,j}=\delta_{j,q}a_{i,p}$.

That is, B is the matrix whose columns are all zeros except for the q column that is equal to the p row of A.

(ii) $A\cdot(I_{m\times m}+x\cdot E'_{p,q,m})=C=(c_{i,j})_{i\in[n],j\in[m]}$ where for $i\in[n], j\in[m]$: $c_{i,j}=a_{i,j}+x\cdot\delta_{j,q}\cdot a_{i,p}$ ($\delta_{i,p}$ is Kronecker's $\delta$).

That is, C is the matrix whose columns are all equal to A's columns except for q column that is equal to the q column of A plus x multiplied by the p row of A.

Permutation and Swap Permutation Matrix

Denote as usual the set of all permutations on [n] by:

$S_n = \{\pi: \pi:[n]\to[n]\ 1:1\}$.

Let $\pi \in S_n$ and denote $Ord(\pi)=\min\{k\geq 1: \pi^k=1\}$.

Fix $F=Z_2$. For $\pi\in S_n$ define the associated permutation matrix: $P_{\pi,n}=(a_{ij})_{1\leq i,j\leq n}\in F^{n\times n}$ by:

(1) $a_{ij}=1 \Leftrightarrow j=\pi(i)$ for all $i,j\in[n]$ note the equivalence (1) $\Leftrightarrow$ (2) $\Leftrightarrow$ (3) $\Leftrightarrow$ (4)

(2) $a_{ij}=\delta_{\pi(i),j}$ for all $i,j\in[n]$ (3) $a_{ij}=1 \Leftrightarrow i=\pi^{-1}(j)$ for all $i,j\in[n]$ (4) $a_{ij}=\delta_{i,\pi^{-1}(j)}$ for all $i,j\in[n]$ Proposition 1. For $\pi\in S_n$ and $v=[v_1,\ldots,v_n]^T\in F^n$ $P_{\pi,n}\cdot v=[v_{\pi(1)},\ldots,v_{\pi(n)}]^T$ Proof. Let $u=[u_1,\ldots,u_n]^T=P_{\pi,n}v$ then for $i\in[n]$: $u_i=\Sigma_{1\leq j\leq n}\delta_{i,\pi^{-1}(j)}\cdot v_j=v_{\pi(i)}$ ◆

Proposition 2. For $\pi,\sigma\in S_n$: $P_{\sigma,n}\cdot P_{\pi,n}=P_{\pi\sigma,n}$ which implies: $P_{\pi,n}^{-1}=P_{\pi^{-1},n}$ Proof. Take $v=[v_1,\ldots,v_n]^T\in F^n$ and let $u=[u_1,\ldots,u_n]^T=P_{\pi,n}\cdot v$ and let $w=[w_1,\ldots,w_n]^T=P_{\sigma,n}\cdot u$.

That is $w=P_{\sigma,n}\cdot P_{\pi,n}\cdot v$. Then for $i\in[n]$ $u_i=v_{\pi(i)}$ and hence for $k\in[n]$ $w_k=u_{\sigma(k)}=v_{\pi(\sigma(k))}$. Thus $P_{\sigma,n}\cdot P_{\pi,n}=P_{\pi\sigma,n}$.

It follows from proposition 1 that:

Proposition 3. For $A=(a_{i,j})_{i\in[n],j\in[m]}\in F^{n\times m}$, $P_{\pi,n}\cdot A=B=(b_{i,j})_{i\in[n],j\in[m]}$ where for $i\in[n], j\in[m]$: $b_{i,j}=a_{\pi(i),j}$ That is $\pi$-permutation of each column.

Proposition 4. For $A=(a_{i,j})_{i\in[n],j\in[m]}\in F^{n\times m}$, $A\cdot P_{\pi,m}=B=(b_{i,j})_{i\in[n],j\in[m]}$ where for $i\in[n], j\in[m]$: $b_{i,j}=a_{i,\pi(j)}$ That is $\pi$ permutation of each row.

Definition: for $p,q\in[n]$ define the swap permutation $\pi_{p,q}=\pi_{[p,q]}\in S_n$ by:

$\pi_{p,q}(p)=q$ $\pi_{p,q}(q)=p$ $\pi_{p,q}(i)=i$ for all $i\in[n]$ $i\neq p$ and $i\neq q$ And define the swap permutation matrix by $P_{p,q,n}=P_{\pi[p,q],n}$ When $p=q$ $P_{p,q,n}=I_{e\times n}$. Obviously the interesting case is when $p\neq q$, Right product with $P_{p,q,n}$ switches the p and q rows. Left product with $P_{p,q,n}$ switches the p and q columns.

Definition—Elementary Matrix

Define for $p,q\in[n]$, $p\neq q$ and $x\in F$:

$$E_{p,q,n,x}=I_{n\times n}+x\cdot E'_{p,q,n}$$

Recall that right product with this matrix amounts to adding x multiplied by the q row to the p row. Left product with this matrix amounts to adding x multiplied by the p column to the q column. Define for $p\in[n]$ and $x\in F$:

$$E_{p,n,x}=I_{n\times n}+(x-1)\cdot E'_{p,p,n}$$

Note that tight product with this matrix amounts to multiplying the p row multiplied by x, while leaving all other rows unchanged. Left product with this matrix amounts to multiplying the p column multiplied by x, while leaving all other columns unchanged. This type of elementary matrix is not relevant to our $Z_2$ applications, but they are relevant to other applications.

Set $$E^*_{0,n}=\{E_{p,n,x}: p\in[n], x\in F\setminus\{0\}\}$$

$$E^*_{1,n}=\{E_{p,q,n,x}: p,q\in[n], p\neq q\ x\in F\setminus\{0\}\}$$

$$E^*_{2,n}=\{P_{p,q,n}: p,q\in[n], p\neq q\}$$

$$E^*_n=E^*_{0,n}\cup E^*_{1,n}\cup E^*_{2,n}.$$

$E^*_n$ is called here the set of elementary matrix in $F^{n\times n}$.

Inverse of Elementary Matrix is Elementary Matrix of the Same Type

Proposition: For $p,q\in[n]$ $p\neq q$, $x\in F\setminus\{0\}$:

(i) $E_{p,n,x}^{-1}=E_{p,n,x^{-1}}$ (ii) $P_{p,q,n}^{-1}=P_{p,q,n}$ (iii) $E_{p,q,n,x}^{-1}=E_{p,q,n,-x}$ Proof: (i) is obvious, (ii) follows from proposition 2 above and (iii) from:

$$(I_{n\times n}+x\cdot E'_{p,q,n})\cdot(I_{n\times n}-x\cdot E'_{p,q,n})=I_{n\times n}+x\cdot E'_{p,q,n}-x^2\cdot E'_{p,q,n}\cdot E'_{p,q,n}=I_{n\times n}.$$

Diagonalization—Definition

For $k\leq\min(n,m)$ define the k unit diagonal matrix of $F^{n\times m}$, $I_{k,n\times m}$, by:

$[I_{k,n\times m}]_{ij}=1$ for all $1\leq i\leq k$ and $[I_{k,n\times m}]_{ij}=0$ for all $i\in[n]$ and $j\in[m]$ where $i\neq j$ or $i>k$.

Let $A\in F^{n\times m}$. The sequences of matrix $E_1,\ldots,E_N\in E^*_n$ and $E'_1,\ldots,E'_M\in E^*_m$ are said to diagonalize A if for some $k\leq\min(n,m)$:

$$I_{k,n\times m}=E_N\cdot E_{N-1}\cdot\ldots\cdot E_1\cdot A\cdot E'_1\cdot E'_2\cdot\ldots\cdot E'_M$$

Note that this is equivalent to the following (SVD-like) decomposition of A:

$$A=E_1^{-1}\cdot\ldots\cdot E_{N-1}^{-1}\cdot E_N^{-1}\cdot I_{k,n\times m}\cdot E_M'^{-1}\cdot E_{M-1}'^{-1}\cdot\ldots\cdot E_1'^{-1}$$

Diagonalization Theorem

To every $A \in F^{n \times m}$ there exists $E_1, \ldots, E_N \in E^*_n$ and $E'_1, \ldots, E'_M \in E^*_m$ and unique k such that:

$$I_{k,n \times m} = E_N \cdot E_{N-1} \cdot \ldots \cdot E_1 \cdot A \cdot E'_1 \cdot E'_2 \cdot \ldots \cdot E'_M \blacklozenge$$

Observe that k=rank(A) and hence k is unique. We will prove this well known proposition via a constructive proof that provides a greedy-minimization of the number of arithmetic operations and N+M. To this end we must first define associated complexity norm.

Diagonalization with Given Bracket

For $K \geq 1$ $\theta = (\theta_1, \ldots, \theta_K)$ is called here brackets sequence if $\theta_1 \in \{0,1\}$ and for all $i \in \{2, \ldots, K\}$ $\theta_i - \theta_{i-1} \in \{0,1\}$. Let $A \in F^{n \times m}$ and suppose $E_1, \ldots, E_N \in E^*_n$ and $E'_1, \ldots, E'_M \in E^*_m$ diagonalize A for some $k \leq \min(n,m)$, that is $$I_{k,n \times m} = E_N \cdot E_{N-1} \cdot \ldots \cdot E_1 \cdot A \cdot E'_1 \cdot E'_2 \cdot \ldots \cdot E'_M.$$

Let $\theta = (\theta_1, \ldots, \theta_{M+N})$ be brackets sequence that satisfies $\theta_{M+N} = N$. We define θ-ordered diagonalization process—that is, diagonalization process with the elementary matrix $E_1, \ldots, E_N \in E^*_n$ and $E'_1, \ldots, E'_M \in E^*_m$ whose brackets are determined by the sequence θ—to be the sequence $$A = A_0, A_1, A_2, \ldots, A_{M+M} = I_{k,n \times m}$$

Where for $k \in [M+N]$:

$$A_k = E_{\theta(k)} \cdot E_{\theta(k)-1} \cdot \ldots \cdot E_1 \cdot A \cdot E'_1 \cdot E'_2 \cdot \ldots \cdot E'_{k-\theta(k)}.$$

Which implies that for $k \in [M+N]$, when $\theta_k - \theta_{k-1} = 1$:

$$A_k = E_{\theta(k)} \cdot A_{k-1},$$

and when $\theta_k - \theta_{k-1} = 0$:

$$A_k = A_{k-1} \cdot E'_{k-\theta(k)}.$$

The Complexity of a Single Product with Elementary Matrix and Complexity of Diagonalization Let $A = (a_{i,j})_{i \in [n], j \in [m]} \in F^{n \times m}$, define for $i \in [n], j \in [m]$:

$X(A,i) = |\{j \in [m]: a_{ij} \neq 0\}|$ $Y(A,j) = |\{i \in [n]: a_{ij} \neq 0\}|$ $Z(A,i,j) = \max(X(A,i)-1, 0) \cdot \max(Y(A,j)-1, 0)$.

Let $p, q \in [n]$, $p \neq q$ $x \in F \setminus \{0\}$, we define the complexity of the product $E_{p,q,n,x} \cdot A$ by:

$$C(E_{p,q,n,x}, A) = c_1 \cdot (X(A,q)-1)$$

where $c_1 > 0$ is a constant that reflects the complexity of one scalar product and one scalar addition. Recall that right product with $E_{p,q,n,x}$ amounts to adding to the p row x multiplied by the q row, in the case $F = Z_2$ the product is not relevant so $c_1$ depends (of course) on F. The reason for defining this complexity as $c_1 \cdot (X(A,p)-1)$ and not $c_1 \cdot X(A,p)$ is because in our algorithms when we add a scalar product of one row to another where at the "leading 1" column we get cancelation without a need for computation. Likewise we define the complexity of the product $A \cdot E_{p,q,n,x}$ by:

$$C(A, E_{p,q,n,x}) = c_1 \cdot (Y(A,p)-1)$$

Recall that left product with this matrix amounts to adding x multiplied by the p column to the q column. Let $p \in [n]$, $x \in F \setminus \{0\}$, we define the complexity of the product $E_{p,n,x} \cdot A$ by:

$$C(E_{p,n,x}, A) = c_0 \cdot X(A,p),$$

where $c_0 > 0$ is a constant that reflects the complexity of one scalar product. Likewise we define the complexity of the product $A \cdot E_{p,n,x}$ by:

$$C(E_{p,n,x}, A) = c_0 \cdot Y(A,p),$$

Let $p, q \in [n]$, $p \neq q$ we define the complexity of the products $P_{p,q,n} \cdot A$ and $A \cdot P_{p,q,n}$ by:

$$C(P_{p,q,n}, A) = C(A, P_{p,q,n}) = c_2$$

where $c_0 > 0$ is a constant.

The Complexity of Diagonalization

Let $A \in F^{n \times m}$ and suppose $E_1, \ldots, E_N \in E^*_n$ and $E'_1, \ldots, E'_M \in E^*_m$ diagonalize A for some $k \leq \min(n,m)$, that is $$I_{k,n \times m} = E_N \cdot E_{N-1} \cdot \ldots \cdot E_1 \cdot A \cdot E'_1 \cdot E'_2 \cdot \ldots \cdot E'_M.$$

Let $\theta = (\theta_1, \ldots, \theta_{M+N})$ be brackets sequence that satisfies $\theta_{M+N} = N$. We define the complexity of the diagonalization process that corresponds to $E_1, \ldots, E_N \in E^*_n$ and $E'_1, \ldots, E'_M \in E^*_m$ and θ to be:

$$C = C_1 + \ldots + C_{M+N}$$

where $C_1, \ldots, C_{M+N}$ are defined as follows. For $k \in [M+N]$, set as before:

$$A_k = E_{\theta(k)} \cdot E_{\theta(k)-1} \cdot \ldots \cdot E_1 \cdot A \cdot E'_1 \cdot E'_2 \cdot \ldots \cdot E'_{k-\theta(k)}.$$

For $k \in [M+N]$, if $\theta_k - \theta_{k-1} = 1$ then $A_k = E_{\theta(k)} \cdot A_{k-1}$, and we define $C_k = C(E_{\theta(k)}, A_{k-1})$ and if $\theta_k - \theta_{k-1} = 0$, then $A_k = A_{k-1} \cdot E'_{k-\theta(k)}$, and we define $C_k = C(A_{k-1}, E'_{\theta(k)})$.

k-Unit Matrix

Definition. Let $A \in F^{n \times m}$ and $\min(m,n) \geq k \geq 1$. A is called k-unit matrix if $[A]_{i,j} = \delta_{ij}$ for all $(i,j) \in [n] \times [m]$ such that $i \leq k$ or $j \leq k$. It means that the first k rows and the first k columns are zero except for the diagonal which is all ones.

The Generic Greedy Diagonalization Algorithm and a Proof to the Diagonalization Theorem The following algorithm is effective for sparse matrix. A variant of this matrix that will later be described seem to be particularly effective for our ensembles of matrix. This target algorithm, which is designed for our ensembles will evolve from this generic algorithm. Let $A \in F^{n \times m}$ be non-zero matrix, A is the input of the following algorithm. Its output is $E_1, \ldots, E_N \in E^*_n$ and $E'_1, \ldots, E'_M \in E^*_m$ that diagonalize A for some $K \leq \min(n,m)$, that is $$I_{K,n \times m} = E_N \cdot E_{N-1} \cdot \ldots \cdot E_1 \cdot A \cdot E'_1 \cdot E'_2 \cdot \ldots \cdot E'_M.$$

A bi-product of the algorithm is $\theta = (\theta_1, \ldots, \theta_{M+N})$ a brackets sequence that satisfies $\theta_{M+N} = N$ and which correspond to the diagonalization process executed by the algorithm.

The algorithm is executed by $K \leq \min(n,m)$ subroutines. It Is supposed inductively that the input of the k-subroutine ($1 \leq k \leq \min(n,m)$) of the algorithm is a matrix $B_k$ such that $B_1 = A$ and for $k > 1$ $B_k$ is (k-1)-unit matrix and an addition the input of the k-subroutine includes $E_1, \ldots, E_{N(k)} \in E^*_n$ and $E'_1, \ldots, E'_{M(k)} \in E^*_m$ such that:

$$B_k = E_{N(k)} \cdot E_{N(k)-1} \cdot \ldots \cdot E_1 \cdot A \cdot E'_1 \cdot E'_2 \cdot \ldots \cdot E'_{M(k)}$$

If $B_k = I_{k-1,n \times m}$ then the algorithm terminates and its output is the input of the k-subroutine. Otherwise the k-subroutine computes the matrix $B_{k+1}$ which, is k-unit matrix and the input of the next subroutine). It is also supposed inductively that the input of the k-subroutine of the algorithm includes for all $i \in [n], j \in [m]$ the values $X(B_k,i), Y(B_k,j)$ and when $[B_k]_{i,j} \neq 0$ then also the value $Z(A,i,j)$. This additional memory required for this storage is $M(B_k)$, which is defined by:

$M_1(B_k) = \{X(B_k,i), Y(B_k,j): i \in [n], j \in [m]\}$ $M_2(B_k) = \{Z(B_k,i,j): i \in [n], j \in [m] \text{ and } [B_k]_{i,j} \neq 0\}$ $M(B_k) = M_1(B_k) \cup M_2(B_k)$.

Note that the memory size required to store $M(B_k)$ is proportional to the memory size required to store the nonzero entries of $B_k$. The k-subroutine of the algorithm starts by listing the coordinates (i,j), $i,j \geq k$ for which $[B_k]_{i,j} \neq 0$ and Z(A,i,j) is minimal that is obtaining $\min(M_2(B_k))$ and forming the set $M_3(B_k) = \{(i,j): k \leq i \leq n, k \leq j \leq m \text{ and } Z(B_k,i,j) = \min(M_2(B_k))\}$ Next the k-subroutine selects the $(i^*, j^*) \in M_3(B_k)$ for which $X(B_k,i) + Y(B_k,j)$ is maximal. The permutation swap elementary matrix will now be utilized to "move" $(i^*, j^*)$ to $(k,k)$. This is done by computing (where required):

$$B_{k,1} = P_{k,i}{*}_{,n} \cdot B_k \cdot P_{k,1}{*}_{,n}$$

(Note that if $k = i^*$ then $P_{k,i}{*}_{,n} = I_{n \times n}$—so this product is not required and if $k = j^*$ then $P_{k,j}{*}_{,n} = I_{n \times n}$ and again this product is not required). Observe that now (k,k) took the place of $(i^*, j^*)$: $(k,k) \in M_3(B_{k,1})$ and $X(B_{k,1},k) + Y(B_{k,1},k)$ is the maximal value of $X(B_{k,1},i) + Y(B_{k,1},j)$ for $(i,j) \in M_3(B_{k,1})$. At this point the algorithm updates X(.), Y(.), Z(.). Observe that:

1) $X(B_{k,1},k)=X(B_k,i^*)$
2) $X(B_{k,1},i^*)=X(B_k,k)$
3) $X(B_{k,1},i)=X(B_k,i)$ for all $i\in[n]$ $i\neq i^*$ and $i\neq k$
4) $Y(B_{k,1},k)=Y(B_k,j^*)$
5) $Y(B_{k,1},j^*)=Y(B_k,k)$
6) $Y(B_{k,1},j)=Y(B_k,j)$ for all $j\in[m]$ $j\neq j^*$ and $j\neq k$ And hence Z is updated accordingly by a swap on its definitions in the rows i* and k and the columns j* and k.

Let $x=([B'_k]_{k,k})^{-1}$. If $x=1$ (which is always the case when $F=Z_2$) set $B_{k,2}=B_{k,1}$. Otherwise multiply the k row by x, i.e., compute the corresponding product with elementary matrix:
$B_{k,2}=E_{k,n,x}\cdot B_{k,1}$ Note again that $X(B_{k,2},k)=X(B_k,i^*)$ and $Y(B_{k,2},k)=Y(B_k,j^*)$. Now $[B_{k,2}]_{k,k}=1$. If $X(B_{k,2},k)=Y(B_{k,2},k)=1$, then the k-step ends here and $B_{k+1}=B_{k,2}$. Suppose now that this is not the case, and assume for example that $X(B_{k,2},k)\geq Y(B_{k,2},k)$ which implies that $X(B_{k,2},k)>1$. To simplify notation write $B=(b_{ij}=b(i,j))_{i\in[n],j\in[m]}=B_{k,2}$. $d=X(B,k)-1=X(B_k,i^*)-1$ is the number of nonzero elements in the k B-row, except for $b_{kk}$ and that B is k-unit matrix. That is, there are $k<j(1)<j(2)\ldots<j(d)\leq m$ such that: $b_{k,j(l)}\neq 0$ for $l\in[d]$ all the rest of the k-row—except for $b_{kk}$—is zeros. It is also provided that the first k−1 elements of the k-column are zeros. If The k-subroutine will now apply left product with d elementary matrix of the type $E^*_{l,n}=\{E_{p,q,n,x}\}$ to zero the k row, that is, the entries $b_{k,i(l)}\neq 0$ for $l\in[d]$. Thus it computes $B_{k,3}$ as follows:

(i) $B_{k,3}=B_{k,2}\cdot E_{k,i(1),n,-b(k,i(1))}\cdot E_{k,j(2),n,-b(k,j(2))}\cdot\ldots\cdot E_{k,j(1),n,-b(k,j(d))}$.

Recall that, left product with $E_{p,q,n,x}$ amounts to adding x multiplied by the q row to the p row and right product with this matrix amounts to adding x multiplied by the p column to the q column.

Each products with $E_{k,j(2),n,-b(k,j(2))}$, $l\in[d]$ is equivalent to adding scalar product of the k column of B to the each one of the d B-columns that intersects with the k row with non-zero entry. This is done in such way that cancels the k element in these columns. Following this procedure the only non-zero element in the k row of $B_{k,3}$ is $[B_{k,3}]_{k,k}$. Note also that each product with $E_{k,j(1),n,-b(k,j(1))}$ implies adding a column whose first (k−1)-entries are zero to another column of this type. The result Is that the first (k−1)-entries of each column of are zero. Since $k<j(1)\leq j(2)\ldots<j(d)\leq m$ also the first (k−1)-entries of each row of $B_{k,3}$ are zero. Thus $B_{k,3}$ is k-unit matrix whose k-row is all zeros except for $[B_{k,3}]_{k,k}$ which is one. At this point the algorithm updates At this point $Y(B_{k,3},k)=Y(B_k,j^*)$ and $X(B_{k,j},k)=1$. If $Y(B_{k,3},k)=1$, then the k-step ends here and $B_{k+1}=B_{k,3}$. Suppose now that this is not the case, and $Y(B_{k,3},k)>1$. For notational simplicity set $C=(c_{ij}=c(i,j))_{i\in[n],j\in[m]}=B_{k,3}$. There are exactly $d'=Y(C,k)-1$ nonzero elements in the k column of C, except for $c_{kk}$. That is, there are $k<i(1)<i(2)\ldots<i(d')\leq n$ such that: $c_{k,i(l)}\neq 0$ for $l\in[d']$ all the rest of the k-column—except for $c_{kk}$—is zeros. The k-subroutine applies now right product with d' elementary matrix of the type $E^*_{l,n}$ to nil the k column (off the (k,k) entry) in the following way:

(ii) $B_{k,4}=E_{i(1),k,n,-c(i(1))}\cdot E_{i(2),k,n,-c(i(2))}\cdot\ldots\cdot E_{i(d'),k,n,-c(i(d'))}\cdot B_{k,3}$ Note that no arithmetic field operations are involved here, in fact the relative complexity of (ii) is marginal. Set $B_{k+1}=B_{k,4}$. A key point w.r.t. complexity is that the almost all the complexity of the k-subroutine is in (i). Now $Z(B_k,i^*,j^*)=Z(B_{k,2},k,k)$ multiplications and additions were involved in (i). This is so since we added the k-column to another column in (i) $X(B_{k,2},k)-1$ times, performing $Y(B_{k,2},k)-1$ products and additions at each of these times. Thus the motivation in choosing (i*,j*) is greedy minimization of the bulk complexity of the k-subroutine. Also $Z(B_k,i^*,j^*)-X(B_{k,1},k)-Y(B_{k,1},k)+2$ is an upper bound to the number of non-zero entries that were added to $B_k$ via (i) and (ii). At this stage the algorithm updates $X(,), Y(,), Z(,)$, as follows: $j_{(1)}\neq 0$ for $l\in[d]$ 1) $Y(B_{k+1},k)=1$
2) $X(B_{k+1},k)=1$
3) $Y(B_{k+1},j(1))=Y(B_{k,1},j(1))-1$ for $l\in[d]$
4) $X(B_{k+1},i(1))=X(B_{k,1},i(1))-1$ for $l\in[d']$ And $Z(,)$ is updated accordingly. Note that the supposition $X(B_{k,2},k)\geq Y(B_{k,2},k)$ led us to start the k subroutine by an elimination of the k-line in (i). Likewise if we had $X(B_{k,2},k)\leq Y(B_{k,2},k)$ we would start the k subroutine by an elimination of the k-column in (i) and then eliminate the k row.

The algorithm terminates at k if $B_k=I_{k-1,n\times m}$ for some k<min(n,m). Otherwise it terminates at k=min(n,m).

An Algorithm that Solves A·x=y when Diagonalization is Provided

Let $A\in F^{n\times m}\setminus\{0\}$ and $y\in F^n$ and suppose that we want to solve the system of linear equations A·x=y for $x\in F^m$. Our first step will be to find $E_1,\ldots,E_N\in E^*_n$ and $E'_1,\ldots,E'_M\in E^*_m$ that diagonalize A for some k≤min(n,m), that is (1) $I_{k,n\times m}=E_N\cdot E_{N-1}\cdot\ldots\cdot E_1\cdot A\cdot E'_1\cdot E'_2\cdot\ldots\cdot E'_M$.

The case k<min(n,m) our algorithm declares failure. But we note that in some uncommon cases a solution might exit to the original equation A·x=y, and even if not there are alternatives to failure-declaration such as small ad-hoc correction to A when min(n,m)−k is small. We would thus assume henceforth, that k=min(n,m) which is equivalent to A being full ranked. It follows from (1) that (2) $A=E_1^{-1}\cdot E_2^{-1}\cdot\ldots\cdot E_{N-1}^{-1}\cdot E_N^{-2}\cdot I_{k,n\times m}\cdot E'_M^{-1}\cdot E'_{M-1}^{-1}\cdot\ldots\cdot E'_2^{-1}\cdot E'_1^{-1}$.

And hence it is desired to solve:

(3) $y=E_1^{-1}\cdot E_2^{-1}\cdot\ldots\cdot E_{N-1}^{-1}\cdot E_N^{-2}\cdot I_{k,n\times m}\cdot E'_M^{-1}\cdot E'_{M-1}^{-1}\cdot\ldots\cdot E'_2^{-1}\cdot E'_1^{-1}\cdot x$, Which is equivalent to:

(4) $z\equiv E_N\cdot E_{N-1}\cdot\ldots\cdot E_1\cdot y=I_{k,n\times m}\cdot(E'_M^{-1}\cdot E'_{M-1}^{-1}\cdot\ldots\cdot E'_2^{-1}\cdot E'_1^{-1}\cdot x)$.

write (5) $u=E'_M^{-1}\cdot E'_{M-1}^{-1}\cdot\ldots\cdot E'_2^{-1}\cdot E'_1^{-1}\cdot x$.

So solving A·x=y is equivalent to solving (6) $z=I_{k,n\times m}\cdot u$.

Note that z is computed from y via N successive coordinates switch/products/additions and products in the field F. This can be done simultaneously with the diagonalization of A. In the equal-dimensional and under determined case, where m≥n, $u=[y,0_F,m-n]^T\in F^m$ solves the equation $z=I_{k,n\times m}\cdot u$. In the over determined case, where m<n, $u\in F^m$ solves the equation $z=I_{k,n\times m}\cdot u$ if $z_i=0$ for all $n\geq i<m$ and $u_i=z_i$ for all $i\in[m]$. Finally, whenever the equation $z=I_{k,n\times m}\cdot u$ has a solution the original equation A·x=y has solution. This follows from the fact that it follows from (5) that in this case:

$x=E'_1\cdot E'_2\cdot\ldots\cdot E'_M\cdot u$

Note again that in the under determined case, where m≥n solution exists when A is full ranked and In the over determined case, where m<n solution exists when A is full ranked and if y is in the subspace spanned by A's columns.

Diagonaling ensemble-2 matrix & solving A·x=y in O(n)-worst-case-complexity (Demonstrating the technique when d=0)

To demonstrate the concept let, at first, $A=(a_{ij})_{i\in[n],j\in[m]}\in F^{n\times m}$ be a matrix with no more than 2 ones per row, that is $A\in M_{2,d,n,m}$ where d=0. It would be assumed without loss of generality that m≥n. The proposed algorithm is a slight variation on the above greedy algorithm. It is characterized by the fact that in the above generic algorithm if at the k-subroutine $X(B_{k,2},k) \leq Y(B_{k,2},k)$ we would carry out the k subroutine by first eliminating the k-column in (i) and then eliminate the k row.

Fix now $d \geq 0$. The passage to the general case where $A \in M_{2,d}$ in the next section, will imply a rather straightforward d scaling of the complexity, i.e. $O(n \cdot (d+1))$-complexity. Observe that every matrix in $M_{2,d,n,m}$, can be formed by taking matrix $A \in M_{2,0}$ and adding to it d random columns (that is, with independently and identically distribute (i.i.d.). Bernoulli with $1/|F|$ probability to each F-scalar per entry). We now add a stopping rule to our algorithm: if at some point in the process it is found that the rank of A is below n–d the algorithm halts.

A key observation is that when we deduct product of a row from another row with the same position of leading non-zero entry—then if each of these 2 rows has at most 2 non-zero entries—the result is also row of at most 2 non-zero entries. Let $e_i$ be the i unit row of $F^m$ and take two such rows:

$u = e_k + x \cdot e_i$ and $v = y \cdot e_k + z \cdot e_j$, $1 \leq k < i, j \leq m$, and note that;

$v - y \cdot u = z \cdot e_j - x \cdot y \cdot e_i$

Before describing the algorithm's steps, we state an inductive assumption that at the beginning of the k subroutine each row of $B_k$ (see generic algorithm above) has no more than 2 non-zero entries. It will be shown that this assumption carry on to k+1. At the beginning of each subroutine we go to a non-zero column with index $j^* \in \{k, k+1, \ldots, m\}$ that have minimal number of non-zero elements. (It is noted in brackets that with high probability (w.r.t. our ensembles) there will be a single one in the $j^*$ column). Let $i^*$ be a row having a minimal number of nonzero entries under the constraint $[B_k]_{i^*,j^*} \neq 0$. Set:

$B_{k,i} = P_{k,i^*,n} \cdot B_k \cdot P_{k,j^*,n}$

Let $x = ([B^t_k]_{k,k})^{-1}$ and compute (when required):

$B_{k,2} = E_{k,n,x} \cdot B_{k,1}$

As a result row $i^*$ was swapped with row k and column $j^*$ was swapped with column k. Next, if $Y(B_{k,2},k) = Y(B_k,j^*) = 1$ them the k subroutine starts by eliminating the k row as in (i). Otherwise, if $Y(B_{k,2},k) = Y(B_k,j^*) > 1$ the k subroutine starts by eliminating the k column as in (ii). In both cases after (i) & (ii) are performed there is one nonzero entry in the k row (in fact 1 in the (k,k) entry) and one non-zero entry in the k column. In addition the resulting matrix, $B_{k+1}$, has no more than 2 non-zero entries at each row. Also, the total number of non-zero entries cannot increase at such subroutine. Note that $Y(B_k,j^*)-1$ is an upper bound to the number of field operations in the k-subroutine. This is so since $X(B_k,i^*)-1 \leq 1$ and hence $Y(B_k,j^*)-1 \geq (Y(B_k,j^*)-1) \cdot (X(B_k,i^*)-1) = Z(B_k,i^*,j^*)$. Recall that $Z(B_k,i^*j^*)$ is the number of field operations in the k-subroutine. Note also that $Y(B_k,j^*)+3$ is an upper bound to the number of products with elementary matrix in the k-subroutine.

Define $C_k = ([B_k]_{i,j})_{k \leq i \leq n, k \leq j \leq m}$. It follows from the above stopping rule that if the number of non-zero columns in $C_k$ is below n–k–d+1 then the algorithm comes to halt. Observe also that by the above, $C_k$ has no more than 2 nonzero entries at each row. It follows that $C_k$ has at most $2(n-k+1)$ non-zero entries. Consider the set of relevant indexes of non-zero columns:

$J_k = \{j \in \{k, \ldots, m\}: \text{the j column, of } B_k \text{ is a non-zero column (i.e. } Y(B_k,j) > 0)\}$.

Note that $2(n-k+1) \geq \Sigma_{j \in J_k} Y(B_k,j)$

Now, if the algorithm did not halt until the k-subroutine started, $|J_k| \geq n-k-d+1$.

It follows that for $j^* \in J_k$ that minimizes $Y(B_k,j)$, $Y(B_k,j^*) \leq 2(n-k+1)/(n-k-d+1)$ $\leq 2(n-k)/(n-k-d)$ $\leq 2/(1-d/(n-k))$.

Thus when $n-k \geq 2d$ (equivalent to $n-2d \geq k$, recall that there are n subroutines) $Y(B_k,j^*) \leq 4$.

When $n=2d \leq k \leq n$ we are left with diagonalization of the last 2d rows. Note that $(n-2d<k \leq n)$ has no more than 2 non-zero entries and that $Y(B_k,j^*)-1 \leq 2d$ is an upper bound to the number of field operations in the k-subroutine and also that $Y(B_k,j^*)+3 \leq 2d+3$ is an upper bound to the number of products with elementary matrix in the k-subroutine.

It follows that the number of field operation is upper-bounded by $3 \cdot n+4d^2$ and at the end of the diagonalization process. Note that when we find $E_1, \ldots, E_N \in E^*_n$ and $E'_M \in E^*_m$ which satisfy the diagonalization requirement:

$A = E_1^{-1} \cdot E_2^{-1} \cdot \ldots \cdot E_{N-1}^{-1} \cdot E_N^{-2} \cdot I_{k,n \times m} \cdot E'_{M-1}^{-1} \cdot \ldots \cdot E'_2^{-1} \cdot E'_1^{-1}$.

It holds that $N+M \leq 6 \cdot n+4d^2+6d$. Note that the upper bounds here are very far from tight.

(Appendix: $\ldots (A+E_{k,n,x})^{-1} = (A \cdot (I+A^{-1} \cdot E_{k,n,x}))^{-1} \ldots$)

The general case, when $d>0$:

Fix $d>0$. For $B = (b_{i,j})_{i \in [n], j \in [m]} \in F^{n \times m}$, and $i \in [n]$ and $j \in [m]$ define:

$X_d(B,i) = |\{j \in [m-d]: b_{i,j} \neq 0\}|$ $Y(B,j) = |\{i \in [n]: b_{i,j} \neq 0\}|$ $Z_d(B,i,j) = \max(X_d(B,i)-1, 0) \cdot \max(Y(A,j)-1, 0)$.

Take $A \in M_{2,d,n,m}$. It would be assumed without toss of generality that $m \geq n$. The proposed algorithm is a variation of the above greedy algorithms. The stopping rule here is that if at some point in the process it is found that the rank of A is not full ranked the algorithm, halts.

Set $W = \{w[w_1, \ldots, w_m] \in F^m: w_i = 0 \text{ for } i \in [m-d]\}$. A key observation is that when we deduct product of a row from another row with the same position of leading non-zero entry—then if each of these 2 rows has at most 2 non-zero entries in the first m–d components—the result is also row of at most 2 non-zero entries in the first m–d components. Let $e_i$ be the i unit row vector of $F^m$. Take two such rows:

$u = e_k + x \cdot e_i + w$ and $v = y \cdot e_k + z \cdot e_j + w'$ $1 \leq k < i, j \leq m$, $w, w' \in W$ and note that;

$v - y \cdot u = z \cdot e_j - x \cdot y \cdot e_i + (w' - y \cdot w)$ where $(w' - y \cdot w) \in W$.

Here too before describing the algorithm's steps, we state an inductive assumption that at the beginning of the k subroutine each row of $B_k$ (see generic algorithm above) has no more than 2 non-zero entries in the first m–d coordinates. It will be shown that this assumption carry on to k+1. At the beginning of each subroutine we go to a non-zero column with index $j^* \in \{k, k+1, \ldots, m-d\}$ that have minimal number of non-zero entries. Let $i^*$ be a row having a minimal number of nonzero entries in the first m–d coordinates under the constraint $[B_k]_{i^*,j^*} \neq 0$. Set:

$B_{k,1} = P_{k,i^*,n} \cdot B_k \cdot P_{k,j^*,n}$

Let $x = ([B^t_k]_{k,k})^{-1}$ and compute (when required):

$B_{k,2} = E_{k,n,x} \cdot B_{k,1}$

As a result row $i^*$ was swapped with row k and column $j^*$ was swapped with column k. Next, if $Y_d(B_{k,2},k) = Y_d(B_k,j^*) = 1$ them the k subroutine starts by eliminating the k row as in (i) [an alternative: do the same when $Y_d(B_{k,2},k) = Y_d(B_k,j^*) \leq 2$]. Otherwise, if $Y_d(B_{k,2},k) = Y_d(B_k,j^*) > 1$ the k subroutine starts by eliminating the k column as in (ii). In both cases after (i) & (ii) are performed there is one nonzero entry in the k row (1 in the (k,k) entry) and one non-zero entry in the k column. In addition the resulting matrix, $B_{k+1}$, has no more than 2 nonzero entries at each row. Also, the total number of non-zero entries cannot increase at such subroutine, it is not hard to compute that $d \cdot Y(B_k,j^*)$ is an upper bound to the number of field operations in the k-subroutine and that $d \cdot Y_d(B_k,j^*)+4$ is an upper bound to the number of products with elementary matrix in the k-subroutine.

Define $C_k = ([B_k]_{i,j})_{k \leq i \leq n, k \leq j \leq m-d}$.

Note the difference from the above definition in the case d=0. It follows from the above stopping rule that if the number of non-zero columns in $C_k$ is below $n-k-d+1$ then the algorithm comes to halt. Observe also that by the above $C_k$ has no more than 2 nonzero entries at each row. It follows that $C_k$ has at most $2(n-k+1)$ non-zero entries. Thereby, consider the set of relevant indexes of non-zero columns:

$J_k \{j \in \{k, \ldots, m-d\}:$ the j column of $B_k$ is a non-zero column (i.e. $Y(B_k,j)>0)\}$.

Note again that $2(n-k+1) \geq \Sigma_{j \in jk} Y(B_k,j)$

Now, if the algorithm did not hah until the k-subroutine started, $|J_k| \geq n-k-d+1$.

It follows that for $j^* \in J_k$ that minimizes $Y(B_k,j)$, $Y(B_k,j^*) \leq 2(n-k+1)/(n-k-d+1)$ $\leq 2(n-k)/(n-k-d)$ $\leq 2/(1-d/(n-k))$.

Thus when $n-k \geq 2d$ (equivalent to $n-2d \geq k$, recall that there are n subroutines) $Y(B_k,j^*) \leq 4$.

When $n-2d<k \leq n$ we are left with diagonalization of the last 2d rows. Recall that $B_k$ ($n-2d<k \leq n$) has no more than 2 non-zero entries in the first $m-d$ coordinates. Also note that by the above $d \cdot 2d$ is an upper bound to the number of field operations in the k-subroutine and that $d \cdot 2d+4$ is an upper bound to the number of products with elementary matrix in the k-subroutine.

It follows that the number of field operation is upper-bounded by $4 \cdot d \cdot n + 4 \cdot d^3$ and at the end of the diagonalization process. Finally when we find elementary matrix $E_1, \ldots, E_N \in E^*_n$ and $E'_1, \ldots, E'_M \in E^*_m$ which satisfy the diagonalization requirement:

$A = E_1^{-1} \cdot E_2^{-1} \cdot \ldots \cdot E_{N-1}^{-1} \cdot E_N^{-2} \cdot I_{k,n \times m} \cdot E'_M^{-1} \cdot E'_{M-1}^{-1} \cdot \ldots \cdot E'_2^{-1} \cdot E'_1^{-1}$.

It holds that $N+M \leq (4 \cdot d+4) \cdot n + 4 \cdot d^3 + 8d$.

Note that the bounds are very far from being tight.

Extending a Solution of Linear Equations to Larger Matrix

Take matrix $A \in F^{n \times m}$ and suppose that the sequences of matrix $E_1, \ldots, E_N \in E^*_n$ and $E'_1, \ldots, E'_M \in E^*_m$ diagonalize A, where for some $k < \min(n,m) = L$, that is:

$I_{k,n \times m} = E_N \cdot E_{N-1} \cdot \ldots \cdot E_1 \cdot A \cdot E'_1 \cdot E'_2 \cdot \ldots \cdot E'_M$ Or equivalently $A = E_1^{-1} \cdot E_2^{-1} \cdot \ldots \cdot E_{N-1}^{-1} \cdot E_N^{-1} \cdot I_{k,n \times m} \cdot E'_M^{-1} \cdot E'_{M-1}^{-1} \cdot \ldots \cdot E'_2^{-1} \cdot E'_1^{-1}$.

Let $B \in F^{n \times q}$ and consider the following set of n equations with $m+q$ unknowns: $z = [A,B] \cdot [x,y]^T$ $[E_1^{-1} \cdot E_2^{-1} \cdot \ldots \cdot E_{N-1}^{-1} \cdot E_N^{-1} \cdot I_{k,n \times m} \cdot E'_M^{-1} \cdot E'_{M-1}^{-1} \cdot \ldots \cdot E'_2^{-1} \cdot E'_1^{-1} \cdot x + B \cdot y]$.

Detailed Description and Proof of the Duality of SC and BEC

Introduction

Let $n>s>t>0$. This section proves that every SC linear code with code block of length n encompassing $n-s$ information bits and having the ability to accommodate t stack bits with success probability $1-\delta$, has dual BEC code with equivalent properties: code block of length n encompassing $n-s$ information bits and ability to fix t erasures with success probability $1-\delta$.

Some Introductory Definitions

For $\alpha \subseteq [n]$ we denote the complement of $\alpha$ w.r.t. $[n]$ by: $\alpha^c = [n] \setminus \alpha$. For $n \geq s, k \geq 1$ define:

$\Omega(n,k) = \{\alpha: \alpha = \{\alpha(1), \ldots, \alpha(k)\} \subseteq [n], \alpha(1) < \ldots < \alpha(k)\}$.

For $G \in F^{n \times m}$ and $\alpha \in \Omega(n,k)$ define: $G_{\alpha,s} = (g_{\alpha(i),j})_{i \in [k], j \in [s]}$.

For $G \in F^{n \times n}$ and $\alpha \in \Omega(n,k)$ define: $v_\alpha = [v_{\sigma(1)}, \ldots, v_{\sigma(k)}]$.

Definition of the Set of SC Encoder Matrix

Fix $F = Z_2$, fix $n > s \geq t \geq 1$, and small $\delta > 0$. Define first:

$SC(n,s) = \{G \in F^{n \times n}: G$ is invertible and G of the form:

$G = [G_1, G_2] = (g_{i,j})_{1 \leq i,j \leq n} = [G_{11}, 0_{s \times (n-s)}; G_{21}, I_{(n-s) \times (n-s)}]\}$ Next define $SC(n,s,t,\delta)$, the set SC encoder matrix that are capable of processing t stack bits with $\delta$ error probability and redundancy (t,s). Take $G = [G_1, G_2] \in F^{n \times n}$ such that $G_1 \in F^{n \times s}$ and $G_2 \in F^{n \times (n-s)}$ than $SC(n,s,t,\delta)$ is the set of matrix $G \in SC(n,s)$ such that when we sample $\alpha \in \Omega(n,t)$ with uniform probability the probability that $G_{\alpha,s}$ is not full ranked is $<\delta$.

The Erasure Channel, the Subspace of Code Words and the Duality Theorem

The parameters of the binary erasure channel includes $\epsilon > 0$, the independent-probability of erasure per coordinate. We fix block length n, then for transmit vector $u = [u_1, \ldots, u_n]^T \in F^n$ every $u_i$ has independent $\epsilon$ probability of being erased, and consequently for $t \in [n]$ there is $\delta(t,\epsilon) > 0$ probability that more than t coordinates of u were erased. (Let $t_0$, a positive integer, be such that the probability for more than $t_0$ erased coordinated when $v = [v_1, \ldots, v_n]^T \in F^n$ is transmitted, is smaller than $\delta'$).

Let now, $V_s = \{v = [v_1, \ldots, v_n] \in F^n: v_i = 0$ for all $i \in [s]\}$.

For invertible $G \in F^{n \times n}$ define: $U_{G,s} = \{v \cdot G^{-1}: v \in V_s\}$.

Take $G = [G_1, G_2] \in F^{n \times n}$ invertible matrix such that $G_1 \in F^{n \times s}$ and $G_2 \in F^{n \times (n-s)}$. Note that for $u \in F^n$: $u \in U_{G,s} \Leftrightarrow v = u \cdot G \in V_s \Leftrightarrow u \cdot G_1 = 0_{1 \times s}$. Thus $G_1$ is the parity check matrix of the code $U_{G,s}$.

The Duality Theorem

Take $G \in SC(n,s,t,\delta)$, $G = [G_{11}, 0_{s \times (n-s)}; G_{21}, I_{(n-s) \times (n-s)}] \in F^{n \times n}$ it than holds that:

(i) If there are t stack, bits in a block of si bits, with locations $\alpha \in \Omega(n,t)$ that are chosen randomly with uniform probability than there is then probability $\delta$ that $n-s$ information bits can be stored via the SC code associated with G.

(ii) If any $u \in U_{G,s}$ is transmitted via the above erasure channel and x is received with t erasures there is then probability $\delta > 0$ than n can be decoded.

While (i) is proved in [ ] the proof of (ii) will be presented here with the complexity cost.

The Fundamental Lemma

Let $u = [u_1, \ldots, u_n] \in U$ and $y = [y_1, \ldots, y_n] \in U$. If $\alpha \subseteq [n]$ satisfies $|\alpha| \leq s$ and $G_{\alpha,s}$ is full ranked and $y_i = u_i$ for all $i \in \alpha^c$ than $y = u$.

Proof. Since $u, y \in U$ than $y \cdot G_1 = u \cdot G_1 = 0_{1 \times s}$. It follows that:

$0_{1 \times s} = (y-u) \cdot G_1 = (y-u)_\alpha \cdot G_{\alpha,s}$.

Now since $G_{\alpha,s}$ is full ranked and $|\alpha| \leq s$ it yields $(y-u)_\alpha = 0$. Hence $y_i = u_i$ for all $i \in \alpha$. Thus $y = u$.

The Erasure Channel Decoder Scheme which Yields a Systematic Code

The input is the above $G_{21} \in F^{(n-s) \times s}$, and $G_{11}^{-1} \in F^{s \times s}$, which is computed once offline and $v' = [v_{s+1}, \ldots, v_n] \in F^{1 \times (n-s)}$, which is the un-coded information vector. Set $v = [0_{1 \times s}, v'] \in V$ 1. Compute $u = v \cdot G^{-1}$.

$u = v \cdot G^{-1} = [0_{1 \times s}, v'] \cdot [G_{11}^{-1}, 0_{s \times (n-s)}; -G_{21} \cdot G_{11}^{-1}, I_{(n-s) \times (n-s)}] = [-v' \cdot G_{21} \cdot G_{11}^{-1}, v'] \in F^{1 \times n}$ This is doable in a low complexity mode, and it yields a systematic code. The steps are:
 (a) Compute $w'=-v' \cdot G_{21} \in F^s$. The arithmetic complexity is upper bounded by $(n-s) \cdot s$, however due to utilization of sparse matrix in our target ensembles, w' will be computed with $O(n)$ complexity.
 (b) Compute $w=-v' \cdot G_{21} \cdot G_{11}^{-1} = w' \cdot G_{11}^{-1}$. The arithmetic complexity is upper bounded by $s^2$. In our sparse ensembles, it might be reduced to $O(s)$.
2. The output is $u=[w,v']$. Transmit $u=[u_1, \ldots, u_n] \in F^n$.

The Encoder Scheme

The input. One part of the input is the received vector $x=[x_1, \ldots, x_n] \in F^n$ which was obtained from the transmit vector $u=[u_1, \ldots, u_n] \in F^n$ via the erasure channel. Another part of the input is the above $G=[G_1, G_2] \in F^{n \times n}$.

1) The erasures are counted and their indexes are stored. Let $\alpha=\{\alpha(1), \ldots, \alpha(t)\} \subseteq [n]$, $\alpha(1) < \ldots < \alpha(t)$ be the indexes of erasures. If $t > t_0$ the decoding is terminated with a statement that u cannot be computed in an unambiguous manner. Due to our assumptions the probability of the event $(t > t_0)$ is smaller than $\delta'$. We would suppose henceforth that $t \leq t_0$.

2) Diagonalize the matrix $G_{\alpha,s}=(g_{\alpha(i),j})_{i \in [t], j \in [s]}$, with algorithm described above (Greedy algorithm for matrix-diagonalization). If in the process it is found that $G_{\alpha,s}$ is not full ranked the decoding is terminated with a statement that u cannot be computed in an unambiguous manner According to our assumptions the probability of such event is $<\delta$. We would suppose henceforth that $G_{\alpha,s}$ is full ranked.

A Non-Operative Observation: Set
$V_x = \{y = [y_1, \ldots, y_n] \in F^n : y_i = x_i \text{ for all } i \in \alpha^c\}$
By the above lemma if $y \in V_x \cap U$ than, since $G_{\alpha,s}$ is full ranked: $y=\alpha$. We are thus looking for $y \in V_x$ such that $y=[y_1, \ldots, y_n] \in V_{x \cap U}$ which implies $$0_{1 \times s} = y \cdot G_1 = y_{\alpha^c} \cdot G_{\alpha^c,s} + y_\alpha \cdot G_{\alpha,s} = u_{\alpha^c} \cdot G_{\alpha^c,s} + y_\alpha \cdot G_{\alpha,s}$$

3) Compute $w_{1 \times s} = u_{\alpha^c} \cdot G_{\alpha^c,s}$. The arithmetic complexity is upper bounded by $(n-s) \cdot s$, however due to utilization of sparse matrix in our target ensembles, w' will be computed with $O(n)$ complexity.

4) It now holds that: $-w = y_\alpha G_{\alpha,s}$. This is a set of s linear equation with t unknowns, has a unique solution due to the assumptions that
 (i) $G_{\alpha,s}$ is full ranked
 (ii) $t \leq s$
 (iii) $u_\alpha$ solves this set if equations The solution can be found via the algorithm of section 6 below that solves such set of equations once the respective matrix was diagonalized. The solution to this set of linear equations is $u_\alpha$ which yields that the receiver knows u.

Detailed Description of the SC Algorithm Over Noisy Channel

Preface

Let $F=Z_2$, and let the algorithm's dimensions be, $n>s>t$. The scheme is based on a code represented by a matrix G
$G=[G_1, G_2]=(g_{i,j})_{1 \leq i,j \leq n}=[G_{11}, 0_{s \times (n-s)}; G_{21}, I_{(n-s) \times (n-s)}] \in F^{n \times n}$
Where $G_{11} \in F^{s \times s}$ is invertible, and in some schemes $G_{11}=I_{s \times s}$.
The inverse is given by;
$G^{-1}=[G_{11}^{-1}, 0_{s \times (n-s)}; -G_{21} \cdot G_{11}^{-1}, I_{(n-s) \times (n-s)}] \in F^{n \times n}$
Note that when $G_{11}=I_{s \times s}$, $G^{-1}=G$.

In the channel under consideration a noise is introduced to the received data vector after its storage in the HAND flash. This will be dealt by the above outlined suboptimal scheme of SC solution merged with ECC solution. The post storage noisy channel is a binary symmetric channel (BSC) with probability $\delta > 0$ of an error and independent coordinates. The problem's parameters include small $\epsilon_1, \epsilon_2 > 0$ that bounds the block error probabilities (e.g. $\epsilon_1 = 10^{-15}$ $\epsilon_2 = 10^{-20}$).

Suppose that for $k \in [n]$, $i=1,2$ the encoder and decoder are provided with systematic linear codes which corresponds to $G'_{k,i} \in F^{d(k,i)+k}$ and has rate $k/(d(k,i)+k)$, such that for all $w \in F^k$, if we store $g_i(w)=[w, G'_k(w)]^t$ (notation implies one column vector on top of another) the block error probability of decoding is bounded by $\epsilon_i$. The channel when $i=1$ is the $BSC(\delta)$ channel and the channel when $i=2$ is the combination of $BSC(\delta)$ with the SC channel when no preceding is done. In practice we would utilize $G'_{k,1}$ only for $k=n-s$ and $G'_{k,2}$ only for $k=s$, so the index k is not essential and is required only for the sake of current presentation. Thus the code can be represented by the subspace $V_k = \{(w, G'_k(w)) : w \in F^k\}$.

Accordingly we formulate the SC noisy channel problem in the following way: we would like to convey (i.e. transmit) information via the vector $v=[v_1, \ldots, v_N] \in F^N$ under the constraint that for some set of $N > t \geq 0$ indexes $\alpha = \{\alpha(1), \ldots, \alpha(t)\} \subseteq [N]$, $\alpha(1) < \ldots < \alpha(t)$, it holds that $(v_{\alpha(1)}, v_{\alpha(2)}, \ldots, v_{\alpha(n)})$ are prescribed.

The Transmitter's Algorithm

The input is $N > s \geq t \geq 1$, (s is chosen w.r.t. N), and with the $\delta > 0$ of the BSC, & $d(s)$, & $n = N - d(s)$, & $d(n-s)$, & $G'_{n-s,1}$ & $G'_{s,2}$. The transmitter's input also includes the matrix $G_1 = (g_{i,j})_{1 \leq i \leq n, i \leq j \leq s} \in F^{n \times s}$, and $\alpha = \{\alpha(1), \ldots, \alpha(t)\} \subseteq [n]$, $\alpha(1) < \ldots < \alpha(t)$, and $(v'_{\alpha(1)}, v'_{\alpha(2)}, \ldots, v'_{\alpha(t)}) \in F^t$, the vector of stock cells.

1) Select a vector $u=[u_1, \ldots, u_{n-s}] \in V_{n-s}$ of information+ECC where $V_{n-s} \subseteq F^{n-s}$ is the above described $BSC(\delta)$ linear code (that corresponds to $G'_{n-s,1}$).
 Note that $G_2 \cdot u^T = u^T$
 Define;
 $G_\alpha = (g_{\alpha(i),j})_{i \in [t], j \in [s]}$,
 $v'_\alpha = [v'_{\alpha(1)}, v'_{\alpha(2)}, \ldots, v'_{\alpha(t)}]^T$
 $u_\alpha = [u_{\alpha(1)}, u_{\alpha(2)}, \ldots, u_{\alpha(t)}]^T$ 2) Compute—when possible—the unique $w \in F^s$ that satisfies $G_\alpha \cdot w = v'_\alpha - u_\alpha$. In case of failure—i.e. non-full-rank $G_\alpha$—go to (F) below, otherwise, continue with the subsequent flow. The straightforward complexity of finding w is $O(s^3)$. The upper bound to complexity in our target ensembles, that admit only sparse G is $O(s^2)$ and it goes down to $O(s)$ in some cases.

3) Compute $G_1 \cdot w^T$. The straightforward complexity is $s \cdot (n-s)$. However due to utilization of sparse matrix in our ensembles, w' will be computed with $O(n)$ complexity.

4) Compute, $y = G \cdot [w, u]^T = G_1 \cdot w^T + g_2 \cdot u^T = G_1 \cdot w^T + u^T$ with n additions. Set $y^1 = [y_1, \ldots, y_s]$ and $y^2 = [y_{s+1}, \ldots, y_n]$.

5) Compute $y^1_{ecc} = G'_{s,2} \cdot y^1$
The output is: $v = [y_{ecc}, y]^T$ (F) In case of failure to compute $w \in F^s$ that satisfies: $G_\alpha \cdot w = v'_\alpha - u_\alpha$, in step (3), restart the entire flow with random permutation on the rows of $G_1$, which is taken from a list known to the transmitter and receiver. A header is attached, that conveys the index of the permutation. If the failure probability of (3) is a small $\epsilon > 0$ probability (e.g. $\epsilon = 10^{-6}$ as a work point) and we do k restarts the overall failure probability is $\epsilon^k$. In practice we can use pseudo random permutations that are either cyclic in $Z_{n-s}$ with pseudo random shift or are XOR with pseudo random sequences modulo $n-s$.

The Receiver's Algorithm

The BSC channel. To every vector $z \in F^k$ that is transmitted via the noisy channel $BSC(\delta)$ we denote by $z+z_e$, the resulting received vector. Note that each coordinate of $z_c$ is selected independently and identically distribute (i.i.d.) with probability $\delta > 0$ to be 1.

The input is the above $G_{21}$, and $G_{11}^{-1}$ which is computed once offline (not required for $G_{11}=I_{s \times s}$) and $v+v_e$. Note that each coordinate of $v_e$ is selected independently and identically distribute (i.i.d.) with probability $\delta>0$ to be 1.

Compute with high success probability ($\epsilon_2$ failure probability):

$y^1 = \text{Decoder}_{BSC(\delta)}(y^1+y^1_e, y^1_{ecc}+y^1_{ecc,e})$. As a result the processor now "knows" $[y^1, y^2+y^2_e]$ (that is with $\epsilon_2$ failure probability):

Following the decoding of (1), compute $G^{-1} \cdot [y^1, y^2+y^2_e]^T = [G_{11}^{-1}, 0_{s \times (n-s)}; -G_{21} \cdot G_{11}^{-1}, I_{(n-s) \times (n-s)}] \cdot [y^1, y^2+y^2_e]^T = [G_{11}^{-1} \cdot y^1, -G_{21} \cdot G_{11}^{-1} \cdot y^1] + y^2 + y^2_e = G^{-1} \cdot [y^1, y^2] + y^2_e = [w, u]^T + y^2_e$.

The main steps are:

Compute $\xi = G_{11}^{-1} \cdot y^1$,

Compute $z = -G_{21} \cdot (G_{11}^{-1} \cdot y^1) = -G_{21} \cdot y$,

Compute with high success probability ($\epsilon_1$ failure probability):

$u = \text{Decoder}_{BSC(\delta)}(u+y^2_e)$.

The output is u.

Note the substantial complexity reduction when $G_{11} = I_{s \times s}$.

What is claimed is:

1. An encoder comprising:
a first vector generator configured to generate a vector u corresponding to data to be stored in a plurality of memory cells including t stuck cells, the vector having n−s entries n, s and t are integers, n is greater than or equal to s, s is greater than or equal to t and t is greater than or equal to zero;
a matrix generator configured to generate an encoding matrix G;
a second vector generator configured to receive information $\alpha$ and information $\mu$ and generate a vector w having s entries based on the information $\alpha$, the information $\mu$, and the encoding matrix G the information $\alpha$ including coordinates of the stuck cells, and the information $\mu$ including values of the stuck cells; and
a third vector generator configured to generate a vector v having n entries based on the encoding matrix G and a vector x, the vector x being a concatenation of the vector w and the vector u, and entries of the vector v correspond to the information $\alpha$ and include the values of the stuck cells according to the information $\mu$.

2. The encoder of claim 1, further comprising:
a header generator configured to generate a header including a label of the encoding matrix G and s.

3. The encoder of claim 1, wherein
$\alpha = \{\alpha(1), \ldots, \alpha(t)\}$, $1 \leq \alpha(1) < \ldots < \alpha(t) \leq n$,
$\mu = \{\mu(1), \ldots, \mu(t)\}$,
$u = [u_1 \ldots u_{n-s}]^T$,
$w = [w_1 \ldots w_s]^T$,
$x = [w_1 \ldots w_s \, u_1 \ldots u_{n-s}]^T$, and
$v = [v_1 \ldots v_n]^T$, $v_{\alpha(j)} = \mu(j)$, $1 \leq j \leq t$ where j is an integer,
the matrix generator is configured to generate the encoding matrix G such that $G = [G_1, G_2] = [G_{11}, 0_{s \times (n-s)}; G_{21}, I_{(n-s) \times (n-s)}]$, where $G_1$ is a n×s first encoding matrix, $G_2$ is a n×(n−s) second encoding matrix, $G_{11}$ is a s×s invertible matrix, $G_{21}$ is a (n−s)×s matrix, $0_{s \times (n-s)}$ is a zero matrix, and $I_{(n-s) \times (n-s)}$ is a unit matrix, the second vector generator is configured to generate the vector w such that, $[G_1 \cdot w]_{\alpha(j)} = \mu(j) - [G_2 \cdot u]_{\alpha(j)}$ ($1 \leq j \leq t$), and the third vector generator is configured to determine a vector y such that $y = [y_1 \ldots y_n]^T = G_1 \cdot w$, and $v = [v_1 \ldots v_n]^T = y + [0 \ldots 0 \, u_i \ldots u_{n-s}]^T$.

4. The encoder of claim 3, wherein the s×s invertible matrix $G_{11}$ is a unit matrix and the (n−s)×s matrix $G_{21}$ includes independently and identically distributed (i.i.d.) entries having values 0 or 1, each of the i.i.d. entries having with a ½ probability of being 1.

5. The encoder of claim 3, wherein, the matrix generator is configured to generate rows of the first encoding matrix $G_1$ based on sampled row vectors that are independently and identically distributed.

6. The encoder of claim 3, wherein the matrix generator is configured to generate the first encoding matrix $G_1$ as a transposed matrix $H^T$ of a check matrix H for binary erasure channel (BEC) codes.

7. A method for encoding data, the method comprising:
generating a vector u corresponding to data to be stored in n memory cells including t stuck cells, the vector u having n−s entries, where n, s, and t are integers, n is greater than or equal to s, s is greater than or equal to t and t is greater than or equal to zero;
generating a vector w having s entries based on information $\alpha$ and information $\mu$, the information $\alpha$ including coordinates of the stuck cells and the information $\mu$ including values of the stuck cells,
generating an n×n encoding matrix G; and
generating a vector v having n entries based on the encoding matrix G and a vector x, the vector x being a concatenation of the vector w and the vector u, and entries of the vector v correspond to the information $\alpha$ and include the values of the stuck cells according to the information $\mu$.

8. The method of claim 7, wherein the encoding matrix G includes a n×s first encoding matrix $G_1$ and a n×(n−s) second encoding matrix $G_2$,
the generating of the vector w includes determining t linear equations and using s roots as entries of the vector w, coefficients of the t linear equations are entries included in rows of the first encoding matrix $G_1$ corresponding to the information $\alpha$, and
determining constant terms of the t linear equations based on calculations of entries in rows of the second encoding matrix $G_2$.

9. The method of claim 8, wherein the generating the vector v adds a product of the first encoding matrix $G_1$ and the vector w to a product of the second encoding matrix $G_2$ and the vector u.

10. The method of claim 8, wherein the generating the vector w replaces the encoding matrix G with another encoding matrix G, if s roots do not exist, the method further comprising:
generating a header including a label of the encoding matrix G used for generating the vector w and s.

11. The method of claim 8, further comprising:
generating the encoding matrix G using at least one matrix that is randomly or pseudo-randomly sampled.

12. The method of claim 11, wherein the generating of the encoding matrix G comprises:
generating a first encoding matrix $G_1$, the first encoding matrix $G_1$ including a s×s invertible matrix $G_{11}$ and a (n−s)×s matrix $G_{21}$; and
generating a second encoding matrix $G_2$ by combining a zero matrix and a unit matrix $I_{(n-s) \times (n-s)}$.

13. The method of claim 12, wherein the generating of the first encoding matrix $G_1$ comprises:
configuring the s×s invertible matrix $G_{11}$ as a s×s unit matrix $I_{s \times s}$; and
configuring the (n−s)×s matrix $G_{21}$ such that the (n−s)×s matrix $G_{21}$ includes independently and identically distributed (i.i.d.) entries having values 0 or 1, each of the i.i.d. entries having a ½ probability of being 1.

14. The method of claim 12, wherein the generating of the first encoding matrix $G_1$ comprises:
generating a row vector including s entries having values of 0 or 1, each of the s entries having a corresponding index, only one of the s entries having a corresponding index between 1 and s'/2 is 1, only one of the s entries having a corresponding index between from (s'/2)+1 through s' is 1, and the probability that a value of each of entries of the row vector of which indexes are from s'+1 through s becomes 1 is ½; and
generating the first encoding matrix $G_1$ based on the generated row vector,
wherein s' is an even number and s'≤s≤t.

15. The method of claim 12, wherein the generating of the first encoding matrix $G_1$ is a transposed matrix $H^T$ of a check matrix H for binary erasure channel (BEC) codes.

16. A method of processing data to be stored in a plurality of memory cells including a plurality of stuck cells, each of the stuck cells storing a value, the method comprising:
obtaining input data and stuck cell information, the stuck cell information indicating locations of the plurality of stuck cells in the plurality of memory cells and the values of the plurality of stuck cells;
generating a first vector based on the input data;
generating an encoding matrix;
generating a second vector based on the stuck cell information and the encoding matrix, a number of entries of the second vector being greater than or equal to a number of the plurality of stuck cells; and
generating encoded data based on the first vector, the encoding matrix and the second vector, the encoded data including values corresponding to the locations of the plurality of stuck cells in the plurality of memory cells and the values of the plurality of stuck cells.

17. The method of claim 16, further comprising:
generating label information, the label information identifying the encoding matrix and the number of entries of the second vector.

18. The method of claim 17, further comprising:
decoding the encoded data using the label information.

19. The method of claim 16, wherein the encoding matrix includes a first encoding matrix part and a second encoding matrix part, the second encoding matrix part including a zero matrix and a unit matrix.

20. The method of claim 19, further comprising:
storing the first encoding matrix part and an inverse of a portion of the first encoding matrix part.

* * * * *